United States Patent
Sakamoto

(10) Patent No.: US 9,666,293 B2
(45) Date of Patent: *May 30, 2017

(54) MEMORY DEVICE HAVING THREE-DIMENSIONAL ARRAYED MEMORY ELEMENTS

(71) Applicant: KABUSHIKI KAISHA TOSHIBA, Minato-ku (JP)

(72) Inventor: Wataru Sakamoto, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/058,629

(22) Filed: Mar. 2, 2016

(65) Prior Publication Data

US 2016/0180949 A1   Jun. 23, 2016

Related U.S. Application Data

(63) Continuation of application No. 14/644,461, filed on Mar. 11, 2015, now Pat. No. 9,312,019.

(Continued)

(51) Int. Cl.
| | |
|---|---|
| *G11C 11/34* | (2006.01) |
| *G11C 16/26* | (2006.01) |
| *G11C 16/14* | (2006.01) |
| *G11C 16/04* | (2006.01) |

(Continued)

(52) U.S. Cl.
CPC .......... *G11C 16/26* (2013.01); *G11C 16/0483* (2013.01); *G11C 16/10* (2013.01);

(Continued)

(58) Field of Classification Search
USPC ............ 365/185.17, 185.18, 185.24, 185.29, 365/185.33
See application file for complete search history.

(56) References Cited

U.S. PATENT DOCUMENTS

| | | |
|---|---|---|
| 7,505,321 B2 | 3/2009 | Scheuerlein |
| 7,679,960 B2 | 3/2010 | Hyun et al. |

(Continued)

*Primary Examiner* — Trong Phan
(74) *Attorney, Agent, or Firm* — Oblon, McClelland, Maier & Neustadt, L.L.P.

(57) ABSTRACT

A memory device includes a first memory element provided on a first side of a semiconductor member, the first memory element including a first charge storage layer provided between the first side of the semiconductor member and a first electrode film, the semiconductor member extending to a first direction, the first side of the semiconductor member being along the first direction; a second memory element on a second side of the semiconductor member, the second memory element including a second charge storage layer provided between the second side of the semiconductor member and a second electrode film, the second side being opposed on the first side with the semiconductor member; a cell source line connected to an end of the semiconductor member; and a control unit. The control unit is configured to, when reading out a data from the first memory element, apply a first voltage to the second electrode film, the first voltage being negative with respect to a voltage of the cell source line, and apply a second voltage to the first electrode film, the second voltage being positive with respect to the voltage of the cell source line.

18 Claims, 28 Drawing Sheets

Related U.S. Application Data

(60) Provisional application No. 62/056,793, filed on Sep. 29, 2014.

(51) Int. Cl.

| | | |
|---|---|---|
| *G11C 16/10* | (2006.01) | |
| *H01L 27/11524* | (2017.01) | |
| *H01L 27/11526* | (2017.01) | |
| *H01L 27/11548* | (2017.01) | |
| *H01L 27/11556* | (2017.01) | |
| *H01L 27/1157* | (2017.01) | |
| *H01L 27/11573* | (2017.01) | |
| *H01L 27/11575* | (2017.01) | |
| *H01L 27/11582* | (2017.01) | |
| *H01L 29/10* | (2006.01) | |
| *H01L 29/49* | (2006.01) | |
| *H01L 29/51* | (2006.01) | |

(52) U.S. Cl.
CPC .......... *G11C 16/14* (2013.01); *H01L 27/1157* (2013.01); *H01L 27/11524* (2013.01); *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 29/1095* (2013.01); *H01L 29/495* (2013.01); *H01L 29/4916* (2013.01); *H01L 29/51* (2013.01)

(56) References Cited

U.S. PATENT DOCUMENTS

| | | | |
|---|---|---|---|
| 7,696,559 | B2 | 4/2010 | Arai et al. |
| 7,906,818 | B2 | 3/2011 | Pekny |
| 7,940,564 | B2 | 5/2011 | Park |
| 8,339,856 | B2 | 12/2012 | Iwata |
| 8,654,586 | B2 * | 2/2014 | Kito .................. G11C 16/0483 365/185.17 |
| 2008/0283901 | A1 | 11/2008 | Walker |
| 2013/0235667 | A1 * | 9/2013 | Nam .................. G11C 16/0483 365/185.17 |
| 2015/0200199 | A1 | 7/2015 | Sakamoto et al. |

* cited by examiner

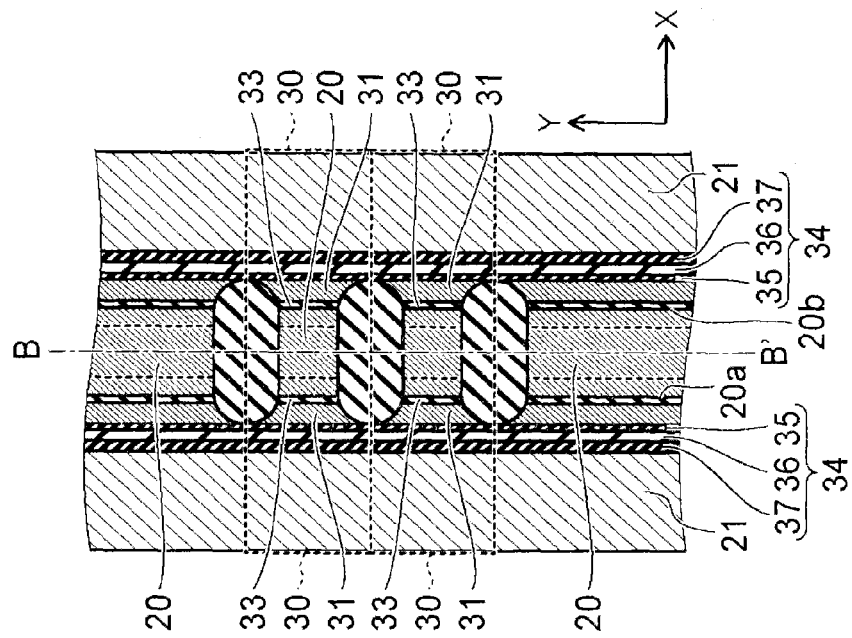
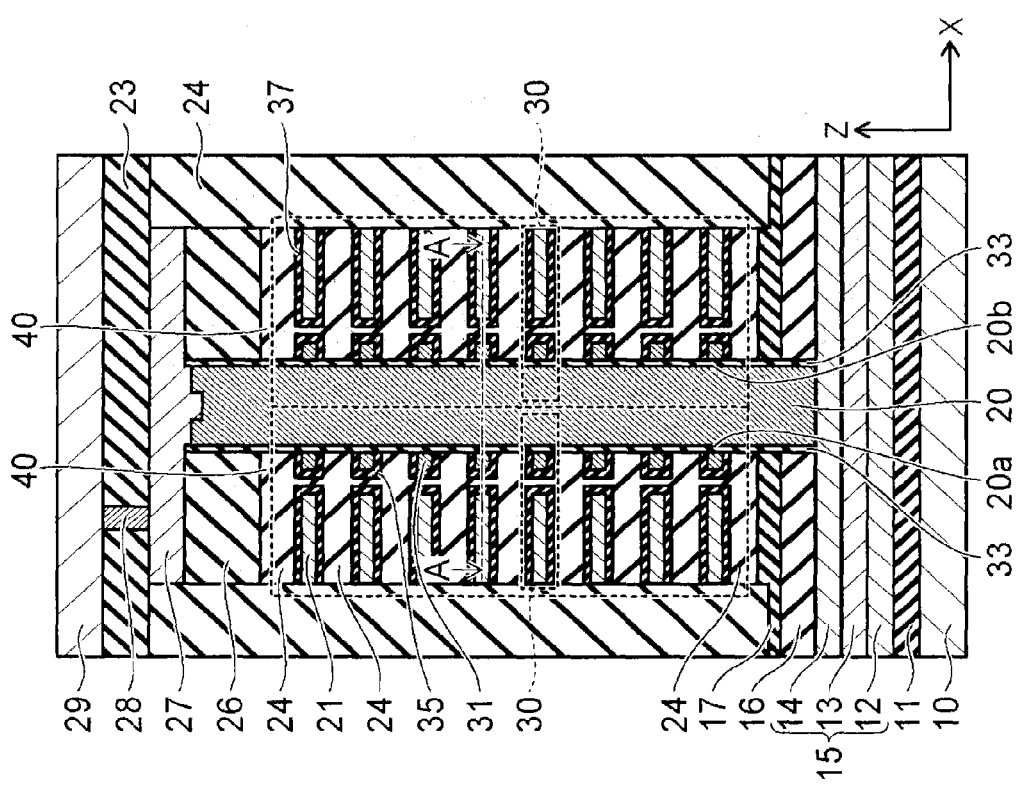
FIG. 3A
FIG. 3B

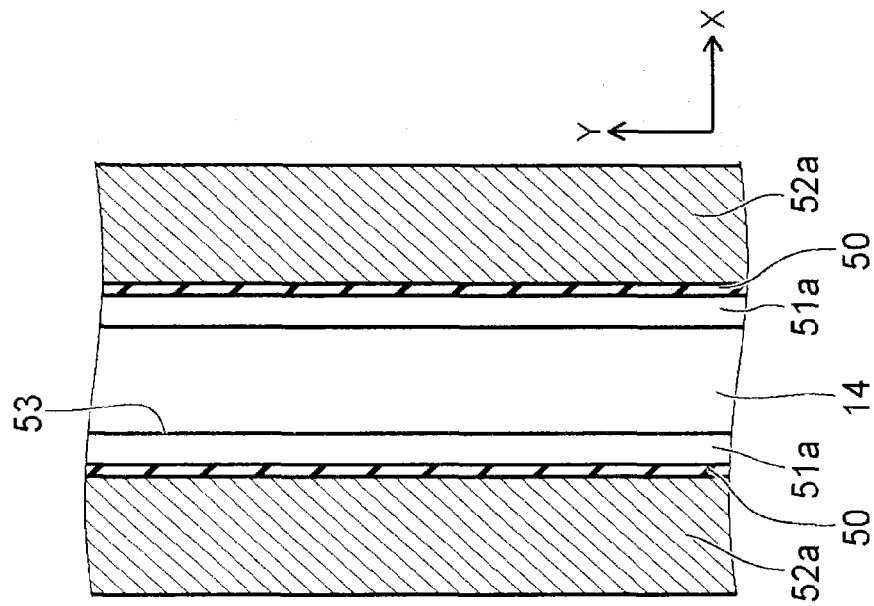
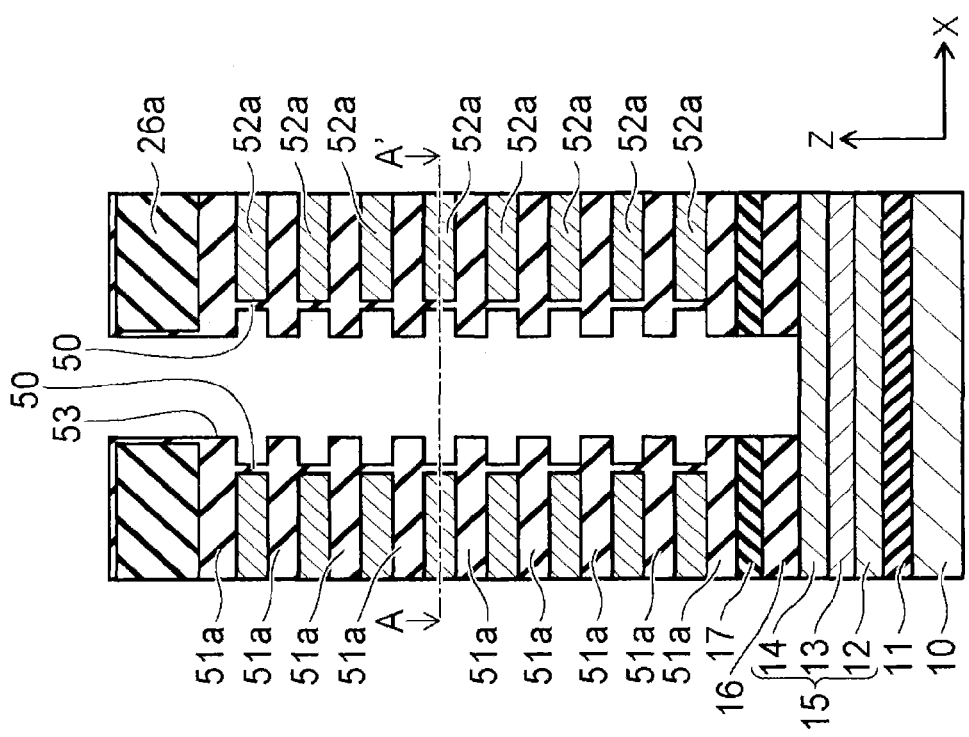
FIG. 15B
FIG. 15A

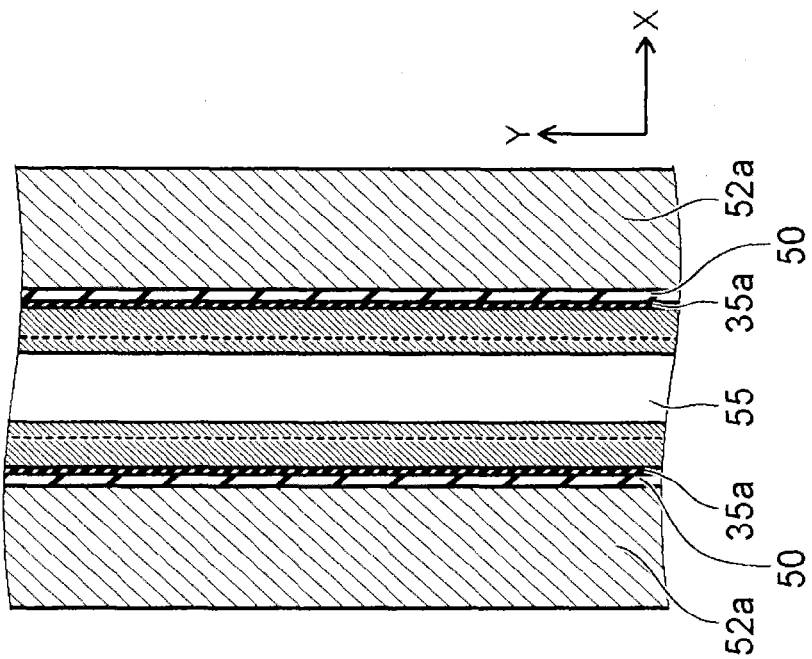
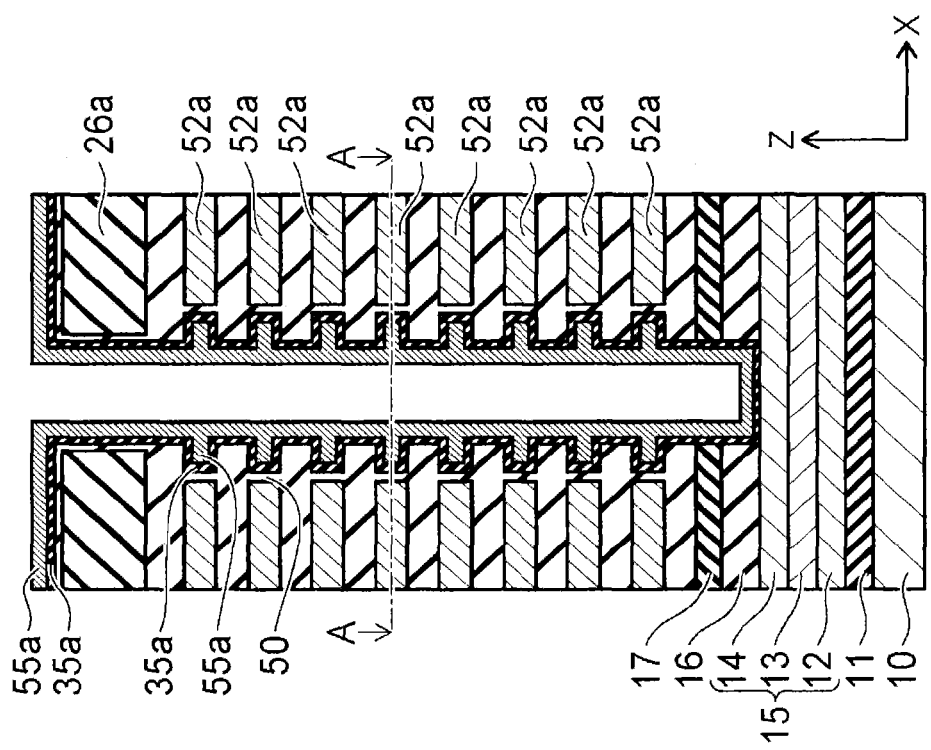
FIG. 16A
FIG. 16B

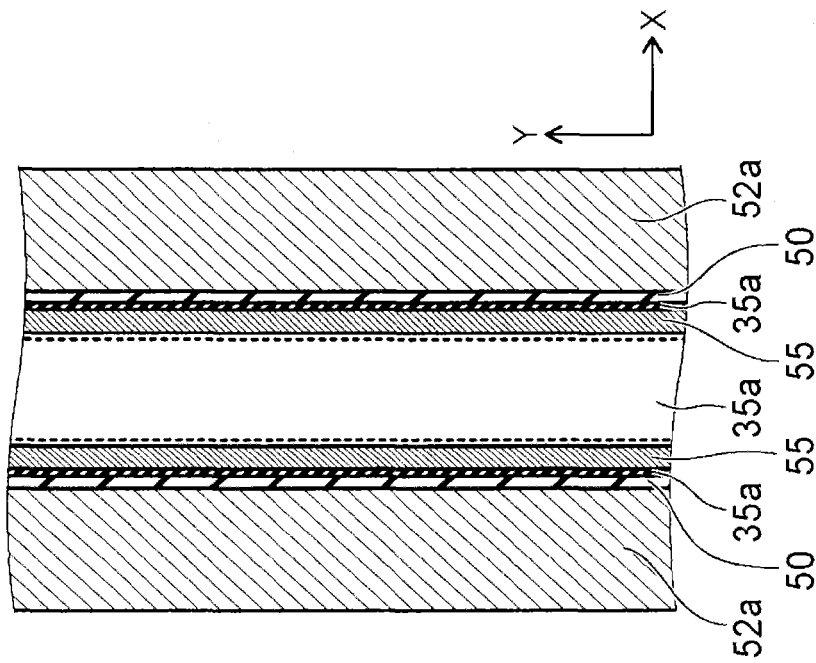
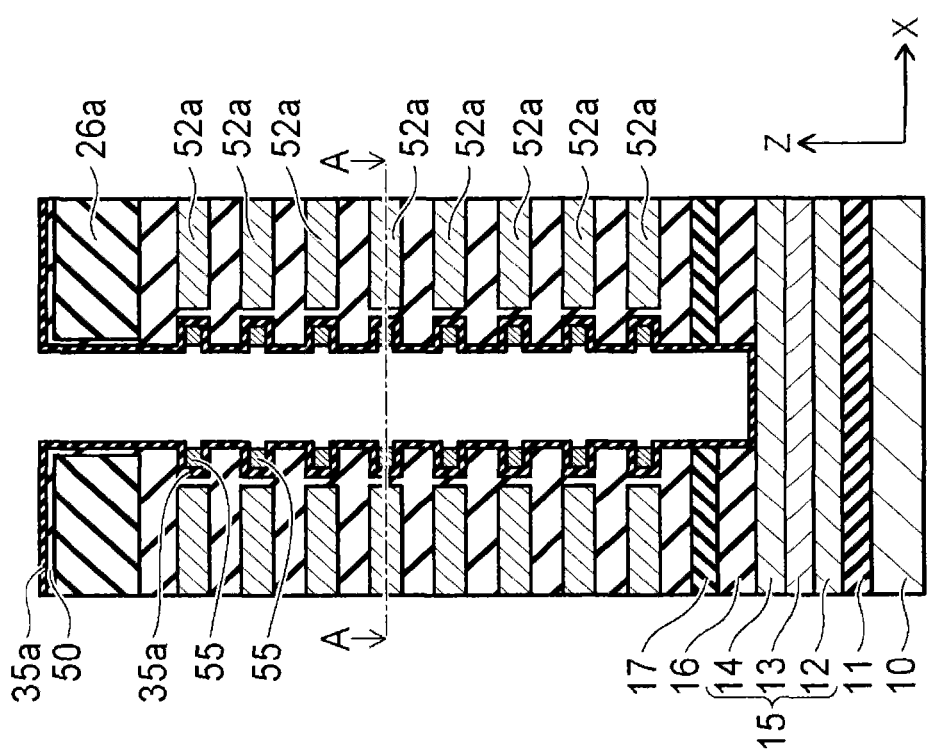
FIG. 17A
FIG. 17B

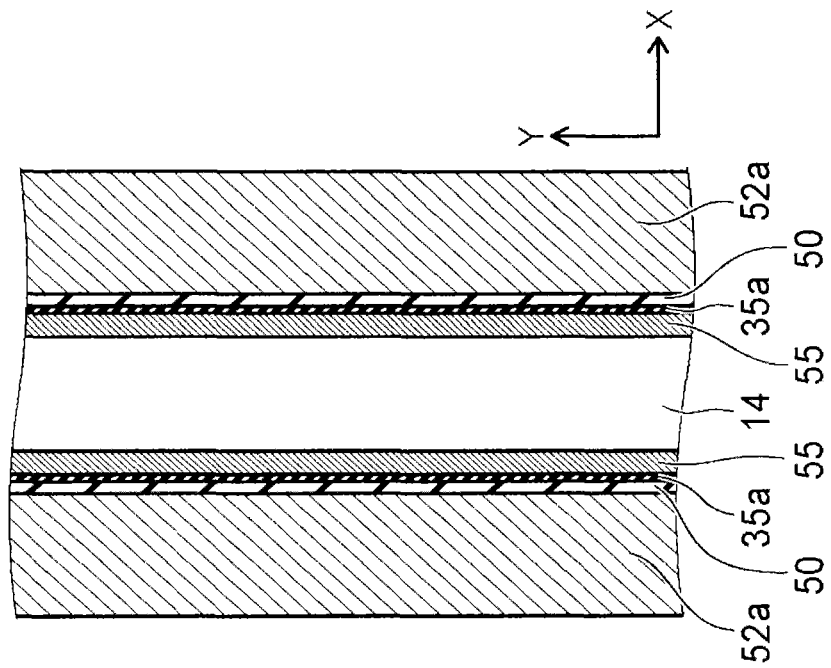
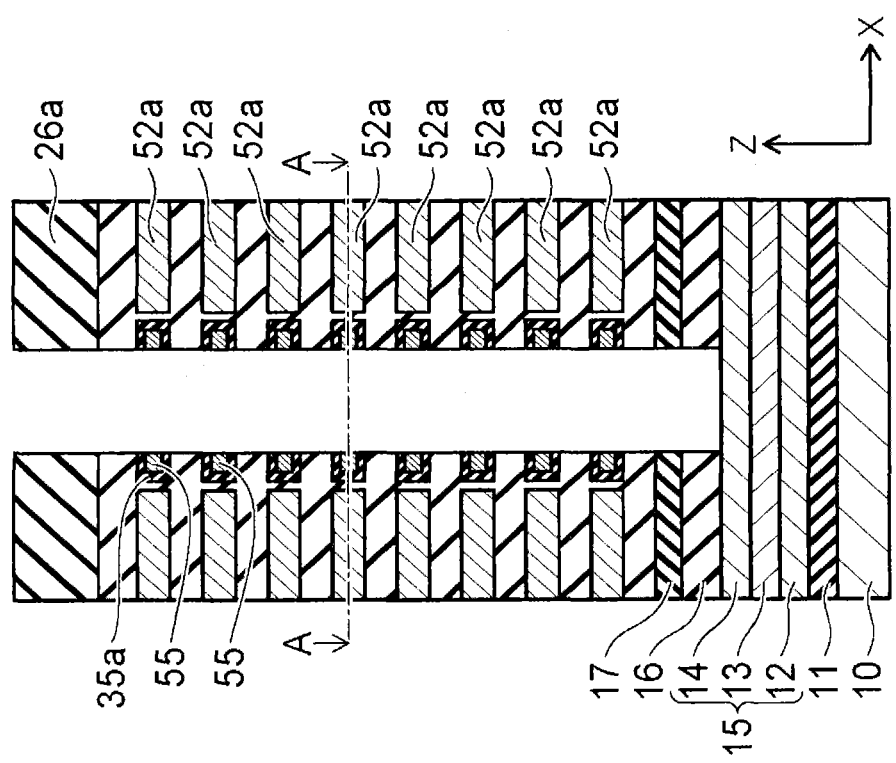
FIG. 18A
FIG. 18B

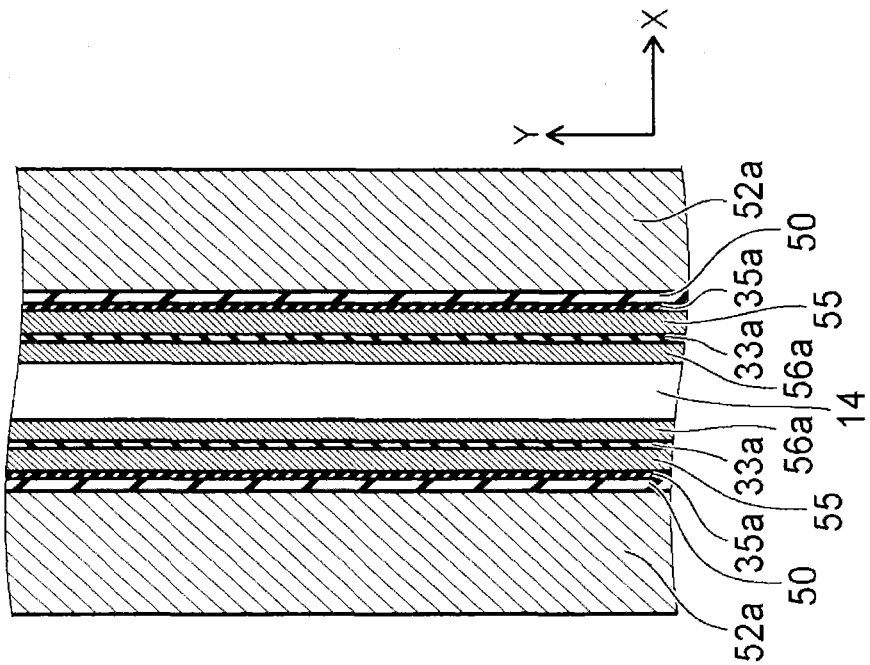
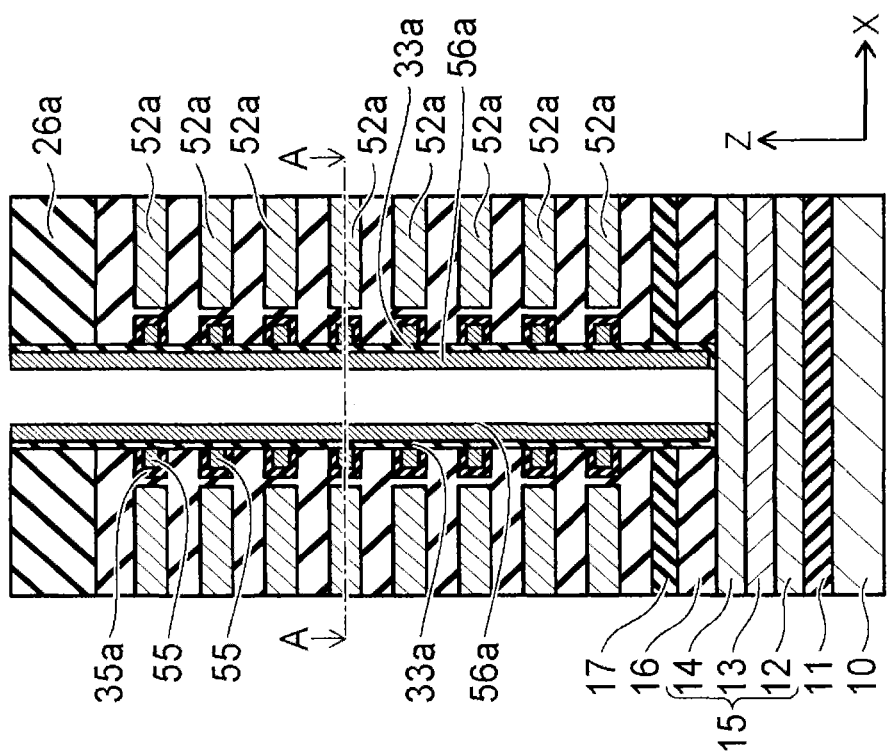
FIG. 20A
FIG. 20B

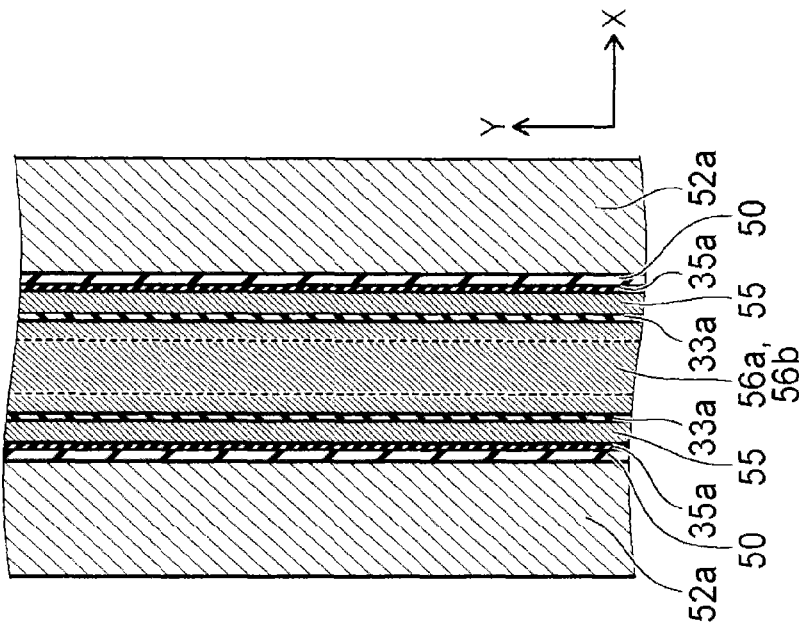
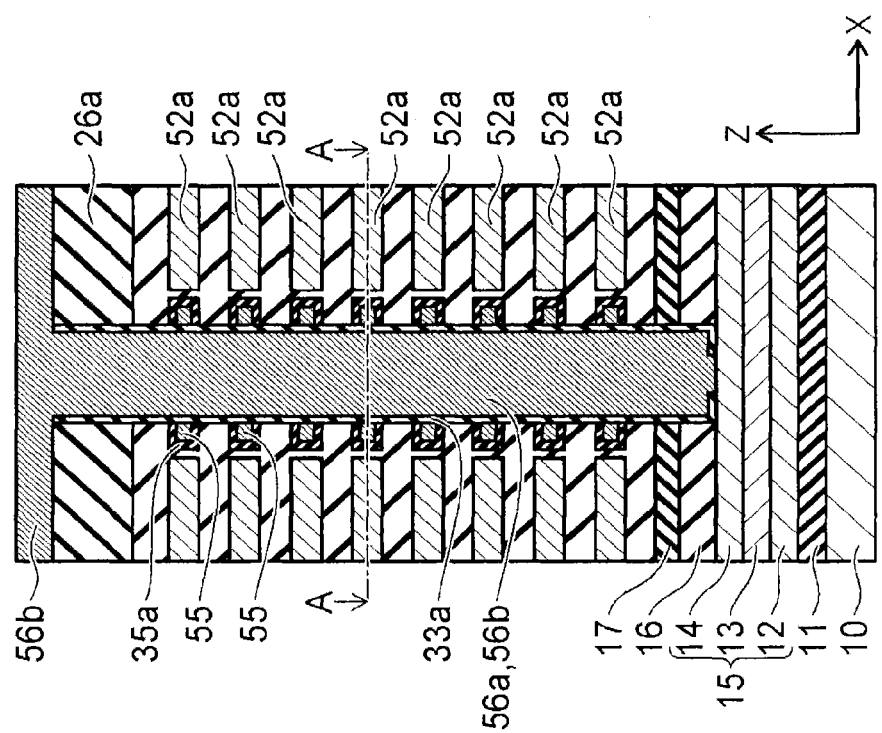
FIG. 21A
FIG. 21B

MEMORY DEVICE HAVING THREE-DIMENSIONAL ARRAYED MEMORY ELEMENTS

CROSS-REFERENCE TO RELATED APPLICATIONS

This application is continuation of U.S. Ser. No. 14/644,461 filed Mar. 11, 2015, now U.S. Pat. No. 9,312,019, and is based upon and claims the benefit of priority from Provisional Application No. 62/056,793 filed on Sep. 29, 2014; the entire contents of each of which are incorporated herein by reference.

FIELD

Embodiment described herein relates to a memory device and method for operating same.

SUMMARY OF THE INVENTION

A memory device includes a first memory element provided on a first side of a semiconductor member, the first memory element including a first charge storage layer provided between the first side of the semiconductor member and a first electrode film, the semiconductor member extending to a first direction, the first side of the semiconductor member being along the first direction; a second memory element on a second side of the semiconductor member, the second memory element including a second charge storage layer provided between the second side of the semiconductor member and a second electrode film, the second side being opposed on the first side with the semiconductor member; a cell source line connected to an end of the semiconductor member; and a control unit. The control unit is configured to, when reading out a data from the first memory element, apply a first voltage to the second electrode film, the first voltage being negative with respect to a voltage of the cell source line, and apply a second voltage to the first electrode film, the second voltage being positive with respect to the voltage of the cell source line.

BACKGROUND

In a NAND flash memory, an integration degree has been increased by refining of a plane structure to reduce a bit cost. In recent years, a technique for attaining further improvement of the integration degree by three-dimensionally stacking memory cells has been proposed.

BRIEF DESCRIPTION OF THE DRAWINGS

FIG. 3A is a sectional view illustrating the memory device according to the first embodiment on a plane parallel to a XZ plane concerning a memory cell region shown in FIG. 1;

FIG. 3B is a sectional view taken along A-A' in FIG. 3A;

FIG. 15A is a sectional view illustrating a manufacturing method for the memory device according to the first embodiment;

FIG. 15B is a sectional view taken along line A-A' in FIG. 15A;

FIG. 16A is a sectional view illustrating a manufacturing method for the memory device according to the first embodiment;

FIG. 16B is a sectional view taken along line A-A' in FIG. 16A;

FIG. 17A is a sectional view illustrating a manufacturing method for the memory device according to the first embodiment;

FIG. 17B is a sectional view taken along line A-A' in FIG. 17A;

FIG. 18A is a sectional view illustrating a manufacturing method for the memory device according to the first embodiment;

FIG. 18B is a sectional view taken along line A-A' in FIG. 18A;

FIG. 20A is a sectional view illustrating a manufacturing method for the memory device according to the first embodiment;

FIG. 20B is a sectional view taken along line A-A' in FIG. 20A;

FIG. 21A is a sectional view illustrating a manufacturing method for the memory device according to the first embodiment;

FIG. 21B is a sectional view taken along line A-A' in FIG. 21A;

DETAILED DESCRIPTION

According to an embodiment, an operation method for a memory device which has a first memory element and a second memory element respectively provided on both sides of a semiconductor member includes applying a first voltage to a second word line, the first voltage being negative for a voltage of a cell source line, and applying a second voltage to a first word line, the second voltage being positive for the voltage of the cell source line when reading out a data from the first memory element.

Various embodiments will be described hereinafter with reference to the accompanying drawings.

First Embodiment

A first embodiment is described.

Figure 1:
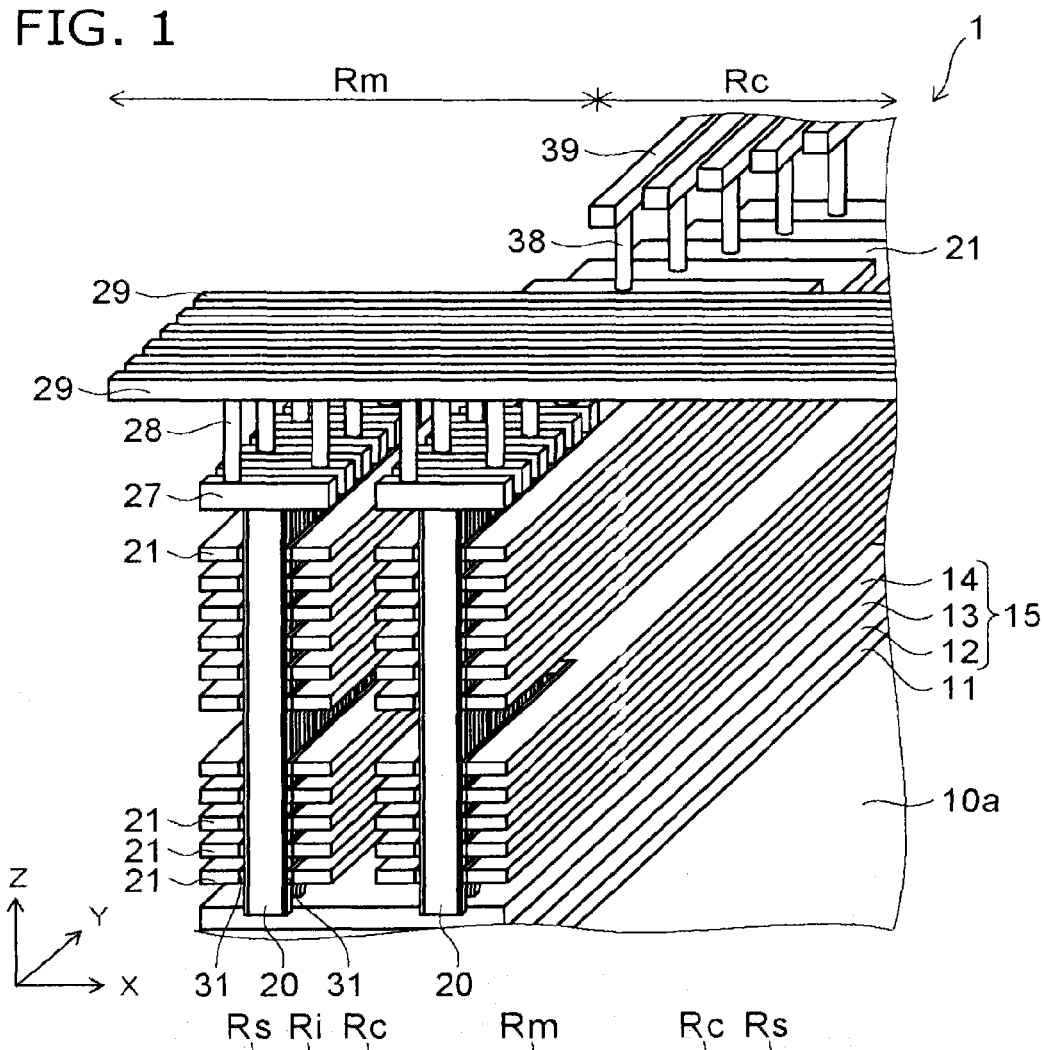
FIG. 1 is a perspective view illustrating a memory device according to the first embodiment.

FIG. 1 is a perspective view illustrating a memory device according to the first embodiment.

Figure 2:
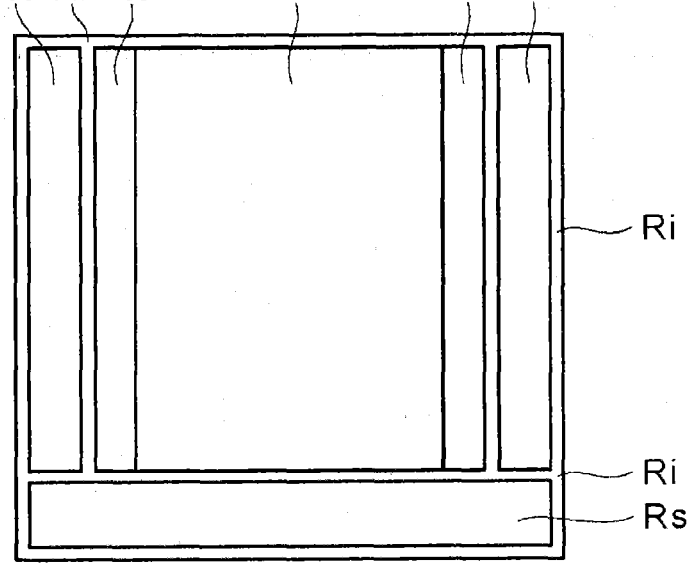
FIG. 2 is a plan view illustrating the memory device according to the first embodiment.

FIG. 2 is a plan view illustrating the memory device according to the first embodiment.

FIG. 3A is a sectional view illustrating the memory device according to the first embodiment on a plane parallel to a XZ plane concerning a memory cell region shown in FIG. 1.

FIG. 3B is a sectional view taken along A-A' in FIG. 3A.

Figure 4:
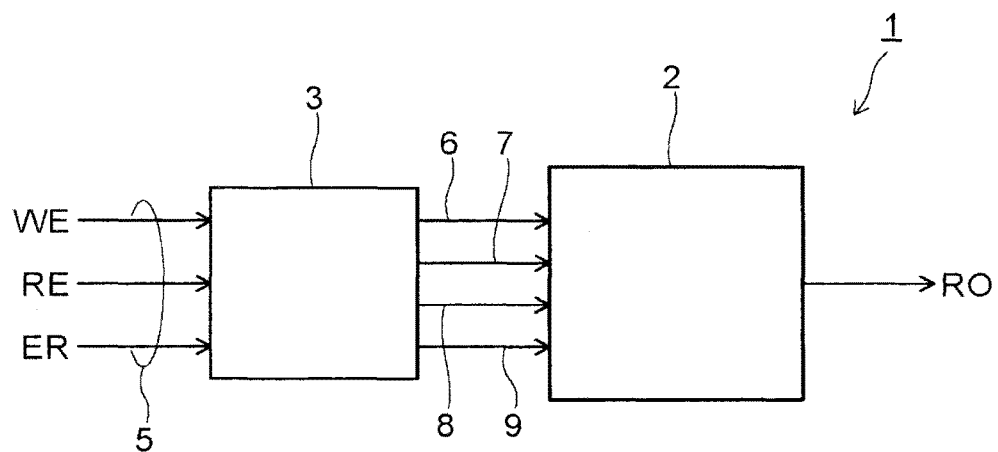
FIG. 4 is a circuit diagram illustrating a part of a circuit of the memory device according to the first embodiment.

FIG. 4 is a circuit diagram illustrating a part of a circuit of the memory device according to the first embodiment.

Figure 5:
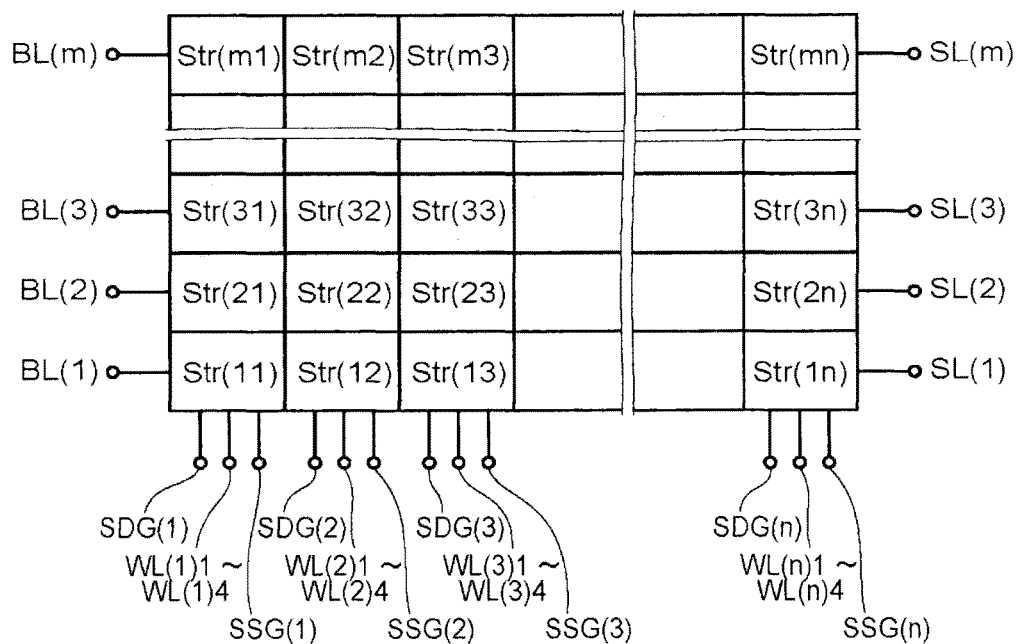
FIG. 5 is a block diagram illustrating arrangement of memory device strings and connection of terminals of the memory device according to the first embodiment.

FIG. 5 is a block diagram illustrating arrangement of memory device strings and connection of terminals of the memory device according to the first embodiment.

Figure 6:
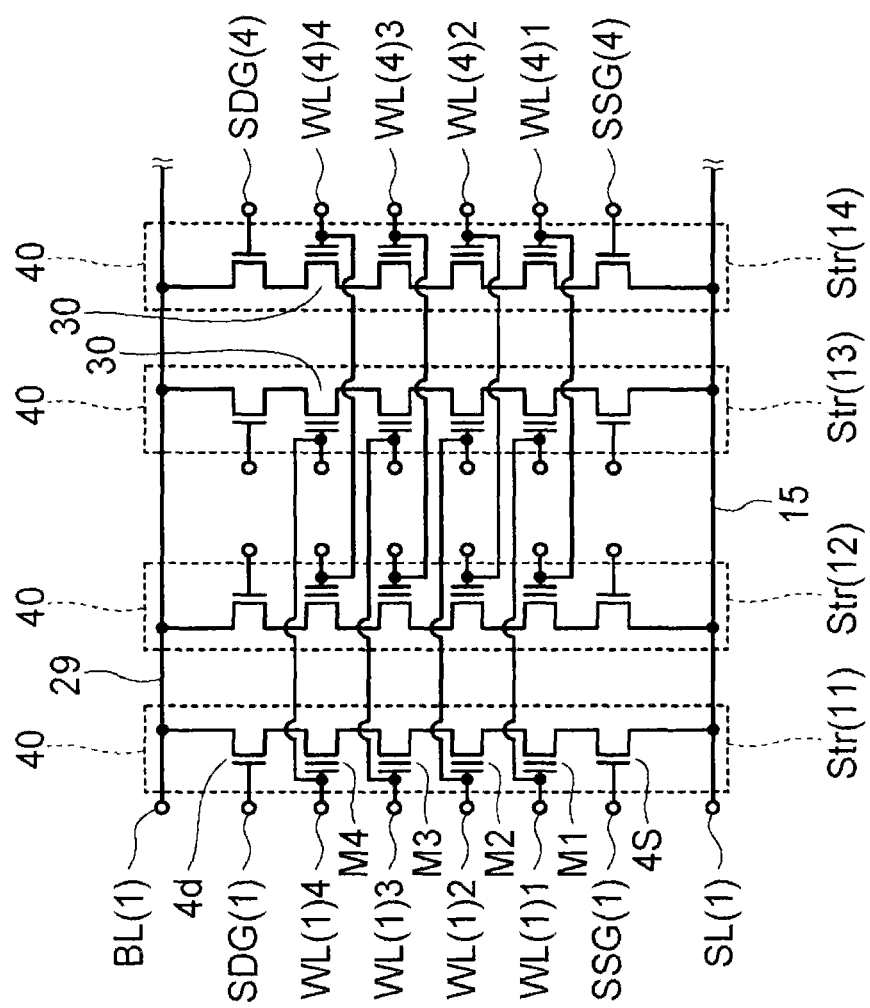
FIG. 6 is a block diagram illustrating the memory device according to the first embodiment.

FIG. 6 is a block diagram illustrating the memory device according to the first embodiment.

As shown in FIGS. 1 and 2, a silicon substrate 10 is provided in a semiconductor memory device 1 according to the embodiment. On the silicon substrate 10, a memory cell region Rm, a word line leading region Rc, and a peripheral circuit region Rs including a control circuit are set. In the following description, for convenience of description, an XYZ orthogonal coordinate system is sometimes used in the specification. In the XYZ orthogonal coordinate system, two directions parallel to an upper surface 10a of the silicon substrate 10 and orthogonal to each other are referred to as "X-direction" and "Y-direction". A direction perpendicular to the upper surface 10a is referred to as "Z-direction".

The memory cell region Rm is a region where memory elements are three-dimensionally arrayed. The word line leading region Rc is provided in the vicinity of the memory cell region Rm in the semiconductor memory device 1. The word line leading region Rc includes a structure for leading interconnects from the memory elements on the memory cell region Rm. The peripheral circuit region Rs includes a control unit including a control circuit that selects, with respect to the led interconnects, voltages corresponding to operation modes of the semiconductor memory device 1 and applies the voltages to the memory elements. The memory cell region Rm, the word line leading region Rc, and the peripheral circuit region Rs are respectively surrounded by insulation regions Ri including insulating layers and are electrically insulated from one another.

As shown in FIGS. 1 and 3A, in the memory cell region Rm, an insulating layer 11, a conductive layer 12, a interconnection layer 13, and a conductive layer 14 are stacked in this order on the silicon substrate 10. For example, the insulating layer 11 is formed of a silicon oxide. The conductive layers 12 and 14 are formed of polysilicon. The interconnection layer 13 is formed of tungsten (W). A cell source line 15 is formed of the conductive layer 12, the interconnection layer 13, and the conductive layer 14. On the cell source line 15, insulating layers 16 and 17 made of, for example, a silicon oxide are provided. A plurality of silicon pillars 20 extending in the Z-direction are provided on the cell source line 15. The silicon pillars 20 are made of, for example, polysilicon. The lower ends of the silicon pillars 20 are connected to the cell source line 15 piercing through the insulating layers 16 and 17. When viewed from the Z-direction, the silicon pillars 20 are arrayed in a matrix shape along the X-direction and the Y-direction and connected to the single cell source line 15 in common.

The silicon pillar 20 is formed in a square pillar shape including a plane 20a extending along the Z-direction and a plane 20b present in a position opposed to the plane 20a in the X-direction. In a lateral direction of one plane 20a of the silicon pillar 20, a plurality of control gate electrode films (first electrode layers) 21 are provided spaced apart from one another along the Z-direction. In a lateral direction of the other plane 20b of the silicon pillar 20, a plurality of control gate electrode films 21 are also provided spaced apart from one another in the Z-direction. The control gate electrode films 21 provided in the lateral directions of the planes 20a and 20b on both sides of the silicon pillar 20 are disposed in positions opposed to each other across the silicon pillar 20. In other words, the silicon pillar 20 extending in the Z-direction is disposed between the control gate electrode films 21 disposed opposed to each other in the X-direction. Two control gate electrode films 21 are disposed between two silicon pillars 20 adjacent to each other in the X-direction. The control gate electrode films 21 extend in the Y-direction. Therefore, the control gate electrode films 21 are not disposed between the silicon pillars 20 arrayed adjacent to each other along the Y-direction. The control gate electrode films 21 are made of a gate electrode material such as polysilicon. The control gate electrode films 21 may be made of a high conductivity material such as tungsten (W), nickel silicide (NiSi), cobalt silicide (CoSi), or molybdenum silicide (MoSi).

Between the control gate electrode films 21 disposed between the silicon pillars 20 adjacent to each other in the X-direction, an insulating layer 24 made of, for example, a silicon oxide is provided. Between the control gate electrode films 21 adjacent to each other in the Z-direction, below the bottom layer of the control gate electrode films 21 and above the top layer of the control gate electrode films 21, insulating layers 24 are provided. The control gate electrode films 21 and the insulating layers 24 are stacked in the Z-direction. A hard mask 26 is provided on the top layer of the insulating layers 24.

The silicon pillars 20 are led above the hard mask 26 and integrated with interconnects 27 that extend in the X-direction. Consequently, the silicon pillars 20 arrayed along the X-direction are connected to the interconnect 27 in common. On the interconnects 27, vias 28 are provided piercing through an inter-layer insulating layer 23. On the vias 28, bit lines 29 extending in the X-direction are provided. The bit lines 29 are connected to the interconnects 27 via the vias 28. In this way, the silicon pillars 20 are connected between the bit lines 29 and the cell source line 15. That is, the semiconductor memory device 1 is a stacked memory device of an I-shaped pillar type.

As shown in FIG. 3B, between one plane 20a of the silicon pillar 20 and the control gate electrode film 21, floating gate electrode films 31 (charge storage layers) made of, for example, polysilicon are provided. The floating gate electrode films 31 are provided at respective crossing points of the silicon pillars 20 and the control gate electrode films 21. Therefore, the floating gate electrode films 31 are arrayed in a matrix shape spaced apart from one another in the Y-direction and the Z-direction. Note that, when viewed from the Z-direction, the shape of the floating gate electrode films 31 may be a fan shape, the control gate electrode film 21 side of which is expanded. In this case, the length in the Y-direction of ends of the floating gate electrode films 31 on the side of the silicon pillar 20 is smaller than the length in the Y-direction of ends of the floating gate electrode films 31 on the side of the control gate electrode film 21. Like the floating gate electrode films 31 on the side of one plane 20a, the floating gate electrode films 31 are also provided between the other plane 20b of the silicon pillar 20 and the control gate electrode film 21. The floating gate electrode films 31 on the side of the other plane 20b of the silicon pillar 20 are also provided at respective crossing points of the silicon pillars 20 and the control gate electrode films 21. Therefore, the floating gate electrode films 31 are arrayed in a matrix shape spaced apart from one another along the Y-direction and the Z-direction.

Between both the planes 20a and 20b of the silicon pillar 20 and the floating gate electrode films 31, tunnel insulating films 33 made of, for example, a silicon oxide are respectively provided. The tunnel insulating films 33 are provided in the respective planes 20a and 20b of the silicon pillar 20. The shape of the tunnel insulating films 33 is a belt shape having a thickness in the X-direction, having a width in the Y-direction, and extending in the Z-direction.

Block insulating films 34 are respectively provided between the floating gate electrode films 31 and the control gate electrode films 21 on the respective sides of both the planes 20a and 20b of the silicon pillar 20. The block insulating films 34 are, for example, three-layer films in which silicon nitride layers 35, silicon oxide layers 36, and silicon nitride layers 37 are stacked in this order from the floating gate electrode film 31 side to the control gate electrode film 21 side. The silicon nitride layers 35 are formed to surround planes of the floating gate electrode films 31 other than planes on which the tunnel insulating films 33 are formed. The silicon oxide layers 36 and the silicon nitride layers 37 are formed to surround the control gate electrode films 21.

The tunnel insulating films 33 are films that are usually insulative but, when a voltage in a range of a driving voltage of the semiconductor memory device 1 is applied thereto, allow a tunnel current to flow. The block insulating films 34 are films that do not substantially allow an electric current to flow even if the voltage in the range of the driving voltage of the semiconductor memory device 1 is applied thereto. An electric film thickness (EOT) of the tunnel insulating films 33 is larger than an electric film thickness of the block insulating films 34. A dielectric constant of the tunnel insulating films 33 is lower than a dielectric constant of the block insulating films.

Note that, in the example described in the embodiment, the block insulating films are the three-layer films. However, the block insulating films are not limited to this. The layers forming the block insulating films are not limited to the silicon oxide layer ($SiO_2$ layer) and the silicon nitride layer ($Si_3N_4$ layer). The block insulating films may be, for example, stacked films including a high dielectric layer such as an $Al_2O_3$ layer, an MgO layer, an SrO layer, an SiN layer, a BaO layer, a TiO layer, a $Ta_2O_5$ layer, a $BaTiO_3$ layer, a BaZrO layer, a $ZrO_2$ layer, a $Y_2O_3$ layer, a ZrSiO layer, an $HfO_2$ layer, an HfAlO layer, an HfSiO layer, an $La_2O_3$ layer, or an LaAlO layer.

In the example described in the embodiment, the floating gate electrode films 31 are formed of polysilicon. However, the floating gate electrode films 31 are not limited to this and may be formed of metal silicide or metal.

In the example described in the embodiment, the control gate electrode films 21 are formed of tungsten W. However, the control gate electrode films 21 are not limited to this and may be formed of metal silicide by embedding a polysilicon film and thereafter siliciding the polysilicon film.

Further, in the example described in the embodiment, the memory cell transistor in which the floating gate electrode film is the conductive film is formed. However, a memory cell of a so-called MONOS (Metal-Oxide-Nitride-Oxide-Semiconductor) type in which the floating gate electrode film is replaced with an insulating film may be formed.

In this way, memory elements 30 including the control gate electrode films 21, the block insulating films 34, the floating gate electrode films 31, and the tunnel insulating films 33 are respectively formed at the crossing points of the silicon pillars 20 and the control gate electrode films 21. The memory elements 30 are formed on both the planes 20a and 20b of the silicon pillar 20 line-symmetrically with respect to an axis B-B' that passes the center in the Y-direction of the silicon pillar 20. The silicon pillar 20 is used in common in the memory elements 30 arrayed in the Z-direction. The memory elements 30 disposed spaced apart from one another in the Z-direction form memory element strings 40. Therefore, the memory element strings 40 are respectively formed on the two planes 20a and 20b of the one common silicon pillar 20.

The word line leading region Rc includes a region used for leading a interconnect for driving the control gate electrode films 21. In the word line leading region Rc, as shown in FIG. 1, the insulating layer 11, the conductive layer 12, the interconnection layer 13, and the conductive layer 14 are stacked in this order on the silicon substrate 10 common to the memory cell region Rm. The cell source line 15 is formed of the conductive layer 12, the interconnection layer 13, and the conductive layer 14. The insulating layers 16 and 17 cover the cell source line 15. In the word line leading region Rc, the insulating layers 24 made of silicon oxide films and the control gate electrode films 21 made of polysilicon films are alternately stacked on the insulating layers 16 and 17.

In the memory cell region Rm, a plurality of the control gate electrode films 21 formed spaced apart from one another in the Z-direction extend in the Y-direction. In the word line leading region Rc, as shown in FIG. 1, a stacked body 25 including the control gate electrode films 21 and the insulating layers 24 is processed in a step shape. In the word line leading region Rc, the vias 38 are provided to pierce through to the layers of the control gate electrode films 21 connected thereto. Word lines 39 extending in the Y-direction are provided on the vias 38. The positions of the word lines 39 in the Z-direction are equal to the positions of the bit lines 29. The word lines 39 are connected to the control gate electrode films 21 via the vias 38. Note that the end in the Y-direction of the stacked body is not limited to the step shape and may be fabricated in a wall surface shape like the other planes.

The word lines 39 led in this way are connected to a control unit described below in the word line leading region Rc. The bit lines 29 and the cell source line 15 are also connected to the control unit in the word line leading region.

In the silicon pillar 20, according to a voltage applied to the control gate electrode films 21, presence or absence of charges in the floating gate electrode films 31, and a voltage applied to both ends of the silicon pillar 20, a channel is formed on the surface of the silicon pillar 20 to provide a route for feeding charges. In the semiconductor memory device 1, a voltage in the range of the driving voltage of the semiconductor memory device 1 is applied to the control gate electrode films 21 to feed the charges, which flow through the formed channel, as a tunnel current via the tunnel insulating films 33. When the tunnel current flows, the charges are injected into the floating gate electrode films 31. The charges injected into the floating gate electrode films 31 are led out to the silicon pillar 20, which provides the channel, via the tunnel insulating films 33. In the semiconductor memory device 1, a threshold voltage of the memory elements 30 changes according to presence or absence of charges in the floating gate electrode films 31. When a predetermined voltage is applied to the control gate electrode films 21 of the memory elements 30, a change in the threshold is determined according to whether an electric current flows. For example, a case in which the electric current flows is associated with "1" and a case in which the electric current does not flow is associated with "0". In this way, in the memory elements 30, data is stored in a non-volatile manner, erased, and read out.

In the semiconductor memory device 1 of the embodiment, the memory element strings 40 are arrayed in a lattice shape on an XY plane on the silicon substrate 10, whereby the memory elements 30 are three-dimensionally arrayed. Therefore, in the semiconductor memory device 1, compared with a case in which memory elements are two-dimensionally arrayed, a bit integration degree per unit area of the silicon substrate 10 can be improved. Typically, a memory unit of 1 bit is allocated per one memory element 30. However, a memory unit of ternary or larger values can be allocated by causing the memory element 30 to store a plurality of values. The integration degree can be substantially further improved. In the semiconductor memory device 1 of the embodiment, one silicon pillar 20 is used in common in two memory element strings 40. Therefore, it is possible to reduce the length in the X-direction and further improve the bit integration degree.

As described above, in the semiconductor memory device 1 of the embodiment, the memory elements 30 are formed in opposed positions on the opposed two planes 20a and 20b. The silicon pillar 20 is used in common between the two memory elements 30. Therefore, a voltage applied to the control gate electrode films 21 of the memory elements 30 on the side of one plane affects an operation condition of the memory elements 30 on the side of the other plane present in the opposed positions. As described below, in order to prevent the silicon pillar 20 from falling into a complete depletion state depending on an applied state of the voltage of any one of the planes 20a and 20b of the silicon pillar 20, the silicon pillar 20 is desirably formed of doped polysilicon in which p-type impurities are introduced or non-doped polysilicon including a defect of an acceptor type.

A circuit configuration of the semiconductor memory device 1 according to the embodiment is described.

As shown in FIG. 4, the semiconductor memory device 1 according to the embodiment includes a memory cell 2 and a control unit 3.

The memory cell 2 includes the memory element strings 40 arrayed in a matrix shape in the memory cell region Rm. The memory elements 30 are three-dimensionally disposed.

The control unit 3 is formed in the peripheral circuit region Rs that is adjacent to the word line leading region Rc. The control unit 3 includes a mode selection line 5 that selects operation modes. The operation modes include a write mode for writing data in the memory elements 30, a readout mode for reading out the data written in the memory elements 30, and an erase mode for erasing the data written in the memory elements 30. The mode selection line 5 includes three selection lines to which, for example, a write enable signal WE, a readout enable signal RE, and an erasing signal ER are respectively input. When the write enable signal is input to the mode selection line 5, the semiconductor memory device 1 changes to the write mode. When the readout enable signal is input, the semiconductor memory device 1 changes to the readout mode. When the erasing signal is input, the semiconductor memory device 1 changes to the erase mode. The control unit 3 may have ternary analog values corresponding to these operation modes to make it possible to set the operation modes according to an analog value allocated to one mode selection line 5.

The control unit 3 includes a bit line selection line 6, a cell source line selection line 7, a selection transistor selection line 8, and a word line selection line 9. The control unit 3 appropriately selects the bit line selection line 6, the cell source line selection line 7, the selection transistor selection line 8, and the word line selection line 9 and applies a voltage corresponding to the operation mode to a desired memory element 30. The bit line selection line 6 selects any one of the bit lines 29 and applies a predetermined voltage to the selected bit line 29. The cell source line selection line 7 selects any one of the cell source lines 15 and applies a predetermined voltage to the selected cell source line. The selection transistor selection line 8 applies a voltage to a gate electrode of a specific selection transistor for selecting a specific column among the memory element strings 40 arrayed in the lattice shape. The word line selection line 9 selects any one of the memory elements 30 and applies a predetermined voltage to the control gate electrode film 21 of the selected memory element 30.

When the write mode is selected by the control unit 3, the memory cell 2 enables an input of write data and writes the write data in the memory element 30 selected by the control unit 3. When the readout mode is selected by the control unit 3, the memory cell 2 reads out data from the selected memory element 30 and outputs the data as readout data RO. The readout data RO is amplified by, for example, a sense amplifier and output.

As shown in FIG. 5, when the matrix of the memory element strings 40 arrayed on the memory cell region Rm is m rows×n columns, the memory element strings 40 are represented as Str(ij). Str(ij) represents the memory element string 40 in an i-th row and a j-th column. A cell source line and a bit line in the i-th row are respectively represented as SL(i) and BL(i).

In FIG. 6, an equivalent circuit of a part of a first row extracted from the matrix of the memory element strings 40 is shown. The memory elements 30 are connected in series and connected between the cell source line 15 and the bit line 29. A selection transistor 4s is connected between the memory element 30 of the bottom layer and the cell source line 15. A selection transistor 4d is connected between the memory element 30 of the top layer and the bit line 29. The selection transistors 4s and 4d may have structure same as the structure of the memory element 30. However, charge injection via the tunnel insulating film 33 is not performed in the selection transistors 4s and 4d. For simplification, the number of the memory elements 30 connected in series is four in the following description. However, five or more memory elements 30 may be connected. In this way, the memory element string 40 includes a plurality of the memory elements 30 and the selection transistors 4s and 4d.

The memory elements 30 belonging to one memory element string 40 are referred to as first bit M1, second bit M2, third bit M3, and fourth bit M4 from the bottom. A word line (a control gate electrode film) of the memory element 30 of a p-th bit in a j-th column is represented as WL(j)p. Selection lines to which gate electrodes of the selection transistors 4s and 4d in the j-th column are connected are referred to as SSG(j) and SDG(J). SSG(j) is a selection line for the selection transistor on the cell source line side. SDG(j) is a selection line for the selection transistor on the bit line side.

A gate terminal of the memory element 30 is formed of the control gate electrode film 21. Gate terminals of the memory elements 30 adjacent to each other in the Y-direction are connected. As described above, the control gate electrode film 21 is led to the end in the Y-direction of the memory cell region Rm and connected to the control unit 3 via the word lines 39 in the word line leading region Rc. The control gate electrode film 21 is sometimes connected to the control gate electrode film 21 of the memory element 30 in another column in the word line leading region Rc. For example, as shown in FIG. 6, when word lines in a first column and word lines in a third column of bits are connected to one another and word lines in a second column and word lines in a fourth column of the bits are connected to one another, the word line in the third column is simultaneously selected when the word line of any one of the bits in the first column is selected. When the word line in the second column is selected, the word line in the fourth column is simultaneously selected. Therefore, a desired row can be selected by providing the selection transistors 4s and 4d. Selection lines SSG and SDG for the selection transistors 4s and 4d are respectively connected by the control gate electrode films 21 of the selection transistors 4s and 4d adjacent to each other in the Y-direction, led to the end in the Y-direction of the memory cell region Rm, and connected to the control unit via the word line 39 in the word line leading region Rc. The selection lines SSG and SDG to which gates of the selection transistors 4s and 4d are connected are not connected to gate electrodes of the selection transistors 4s and 4d adjacent to each other in the X-direction unlike the gate electrodes of the memory elements 30.

The cell source line 15 and the bit line 29 are provided for each row. By selecting the cell source line 15 and/or the bit line 29 of a relevant row, the row can be selected. By selecting the selection lines SSG and SDG of the selection transistors 4s and 4d of a relevant column, a desired column is selected. When the word line 39 is selected, the memory element 30 in a desired bit position is selected.

For example, a memory element M2 of a second bit of the memory element string 40 in a first row and a first column is selected as described below.

The cell source line 15 and/or the bit line 29 in the first row, that is, SL(1) and/or BL(1) is selected.

The selection transistor 4s and/or 4d in the first column, that is, SSG(1) and/or SDG(1) is selected.

Consequently, a memory element string Str(11) in the first row and the first column is selected.

Subsequently, the word line 39 of the second bit M2 in the first column, that is, WL(1)1 is selected and a desired memory element is selected.

Concerning the selection of the cell source line 15 and the bit line 29, both or any one of the cell source line 15 and the bit line 29 is selected according to the operation mode of the semiconductor memory device 1, that is, any one of the write mode, the readout mode, and the erase mode. Concerning the selection of SSG(j) and SDG(j), similarly, both or one of SSG(j) and SDG(j) is selected according to the operation mode. As described below, concerning a voltage applied to the control gate electrode film 21 of the selected memory element 30, a voltage applied to the control gate electrode films 21 of the unselected memory elements, and the like, an appropriate voltage is selected according to the operation mode. Note that the order of the selection of the selection lines is not limited to the above.

Subsequently, an operation method of the semiconductor memory device 1 according to the embodiment is described.

Figure 7:
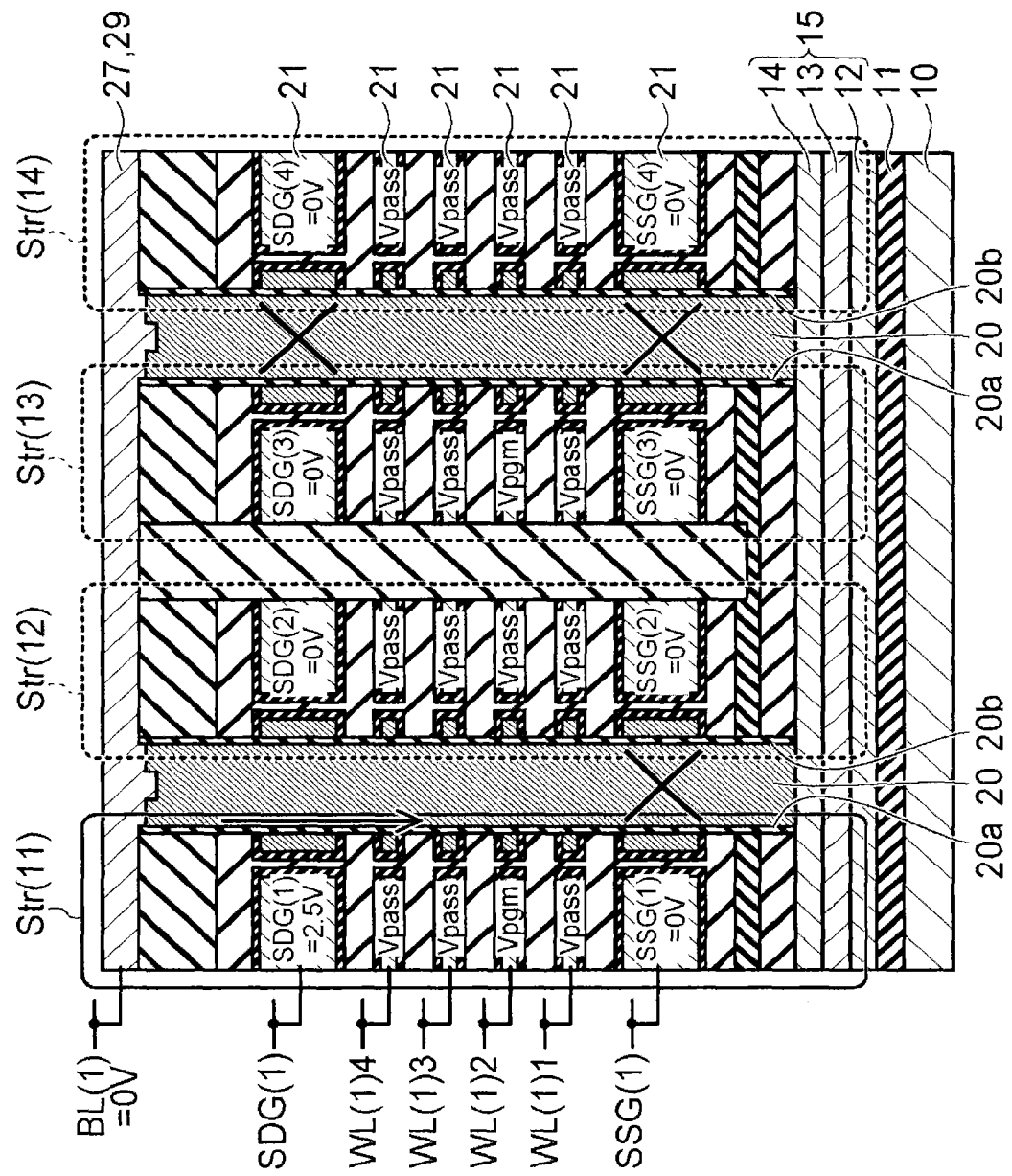
FIG. 7 is a conceptual diagram for describing an operation method of the memory device according to the first embodiment.

FIG. 7 is a conceptual diagram for describing an operation method of a memory device according to the first embodiment.

Figure 8:
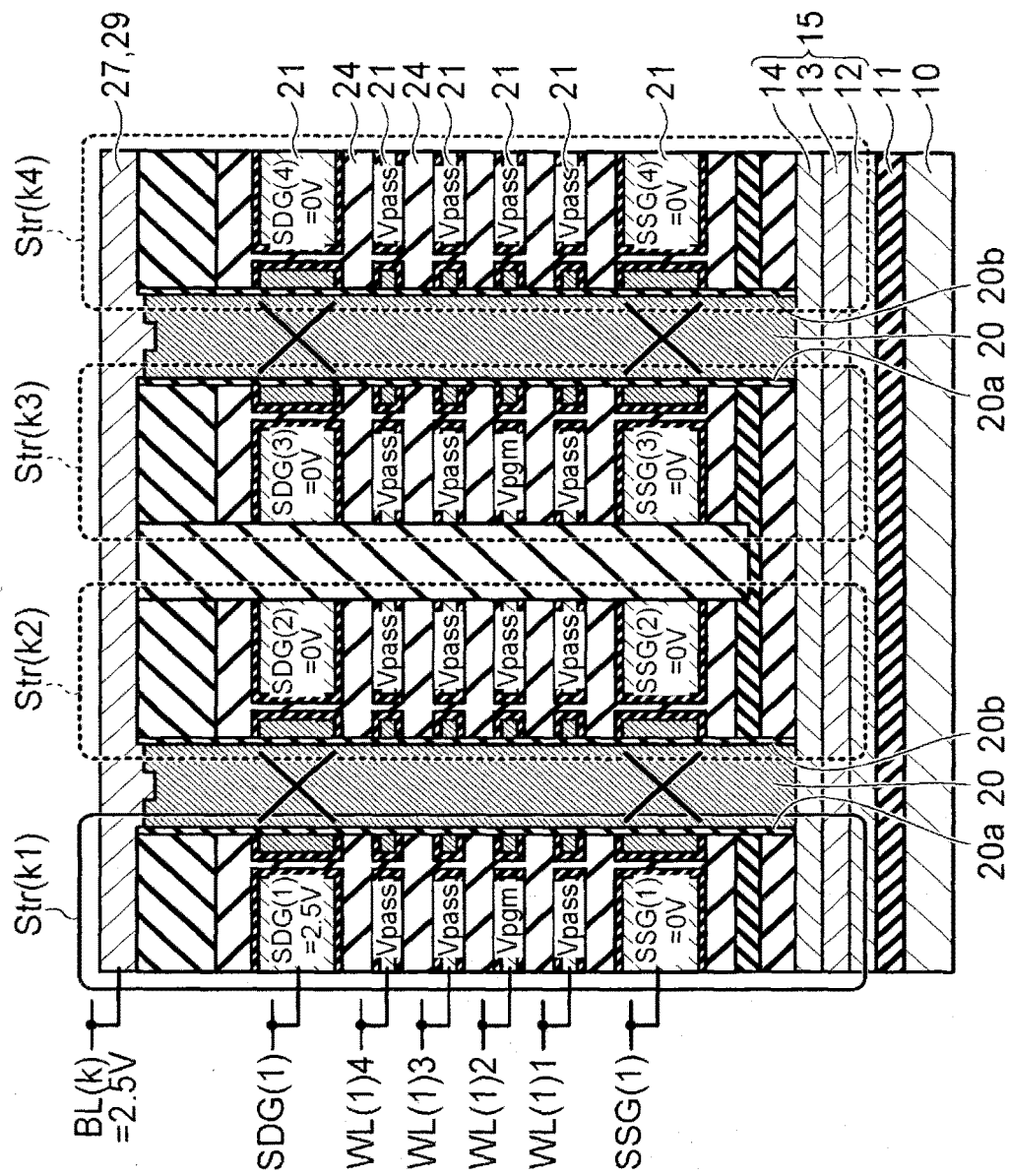
FIG. 8 is a conceptual diagram for describing the operation method of the memory device according to the first embodiment.

FIG. 8 is a conceptual diagram for describing the operation method of the memory device according to the first embodiment.

Figure 9A:
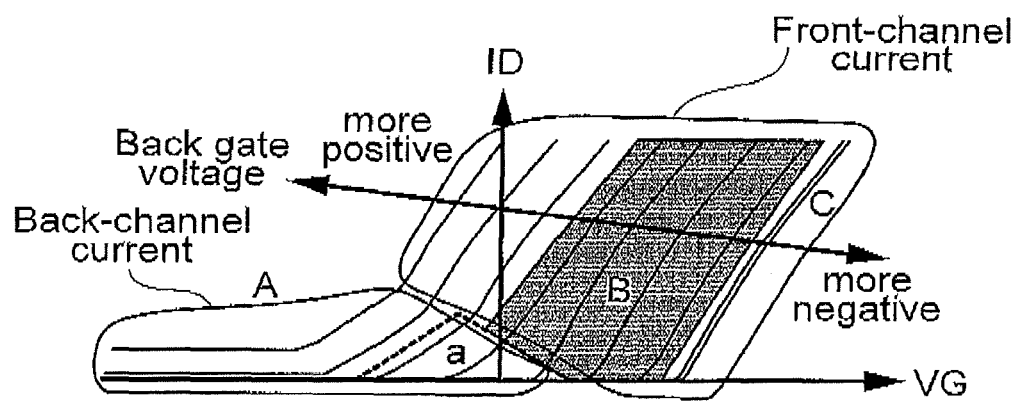
FIG. 9A is a graph indicating to what a voltage on a back gate side affects a threshold characteristic and a I-V characteristic on a front gate side in a MOSFET of an SOI (Silicon-On-Insulator) structure.

FIG. 9A is a graph indicating to what a voltage on a back gate side affects an I-V characteristic which shows the threshold voltage on a front gate side in a MOSFET of an SOI (Silicon-On-Insulator) structure.

Figure 9B:
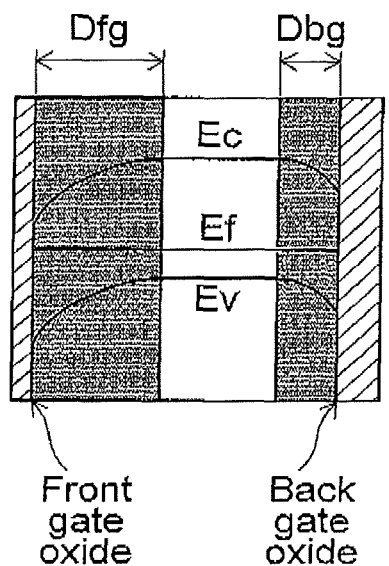
FIG. 9B is a conceptual diagram for describing a shift of a threshold voltage of the MOSFET of the SOI structure in a B region of the graph of FIG. 9A.

FIG. 9B is a conceptual diagram for describing a shift of a threshold voltage of the MOSFET of the SOI structure in a B region of the graph of FIG. 9A.

Figure 10:
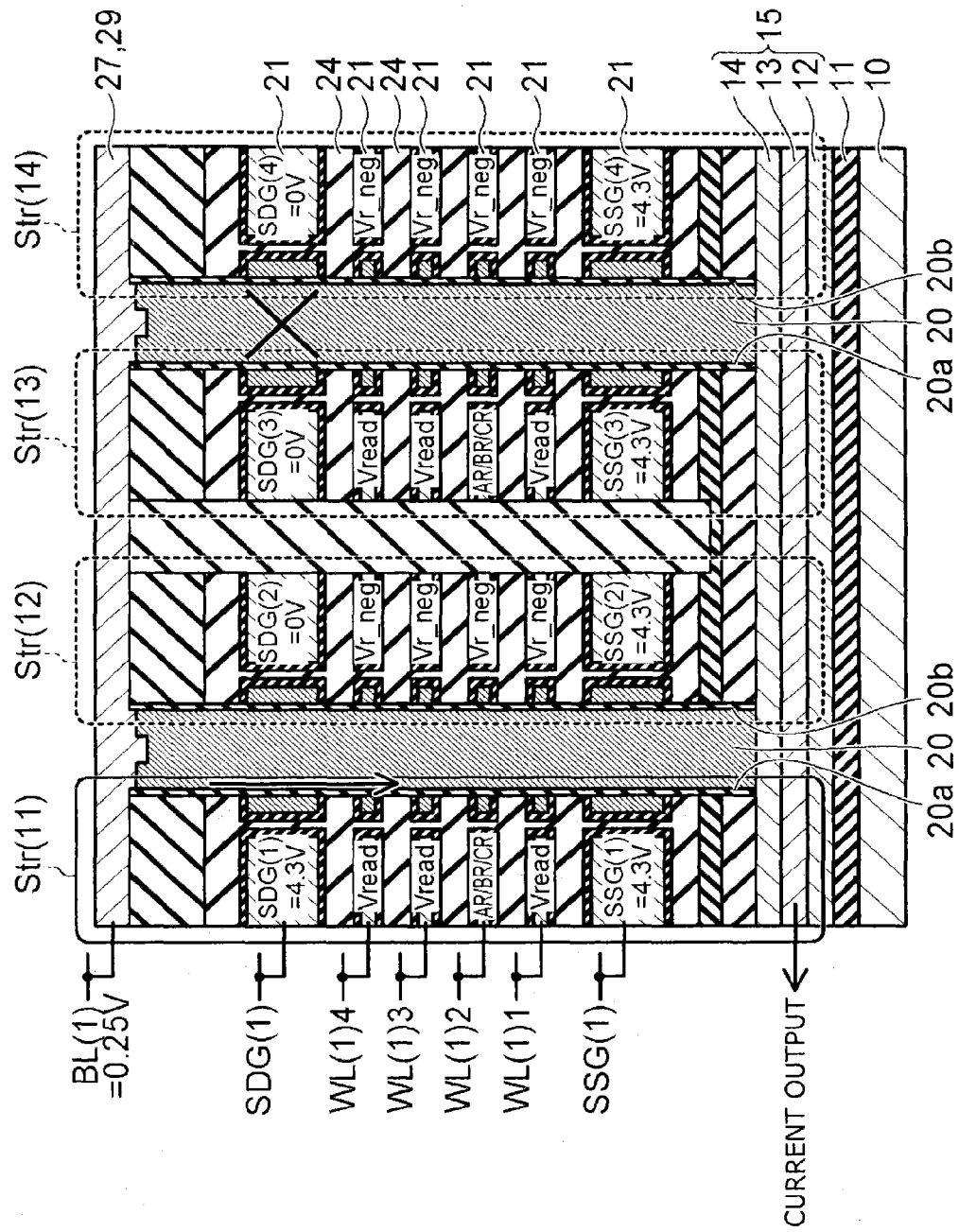
FIG. 10 is a conceptual diagram for describing the operation method of the memory device according to the first embodiment.

FIG. 10 is a conceptual diagram for describing the operation method of the memory device according to the first embodiment.

Figure 11A:
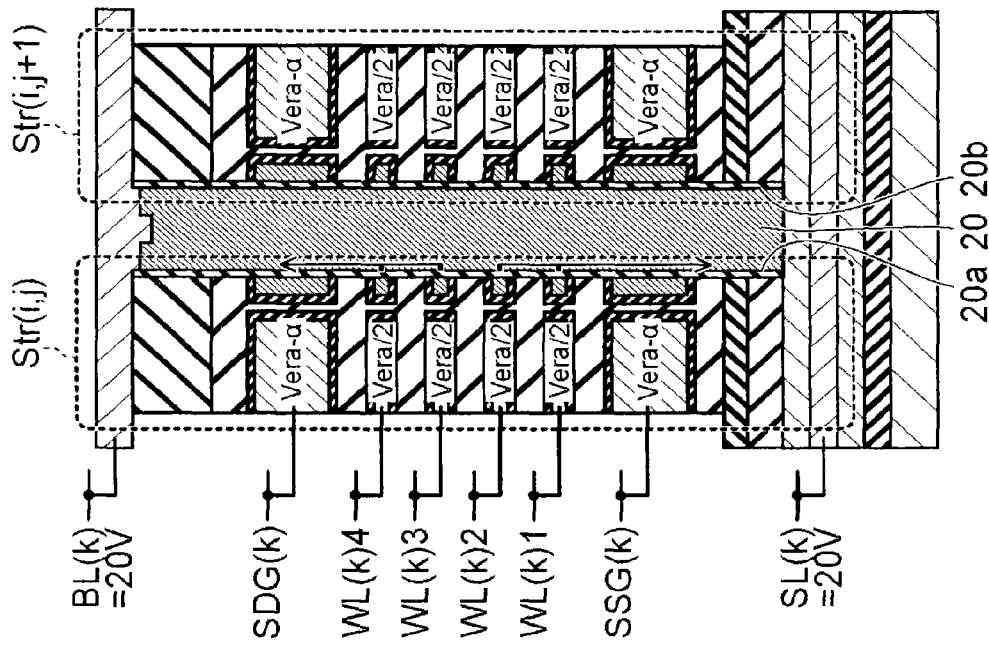
FIGS. 11A and 11B are conceptual diagrams for describing the operation method of the memory device according to the first embodiment.
Figure 11B:
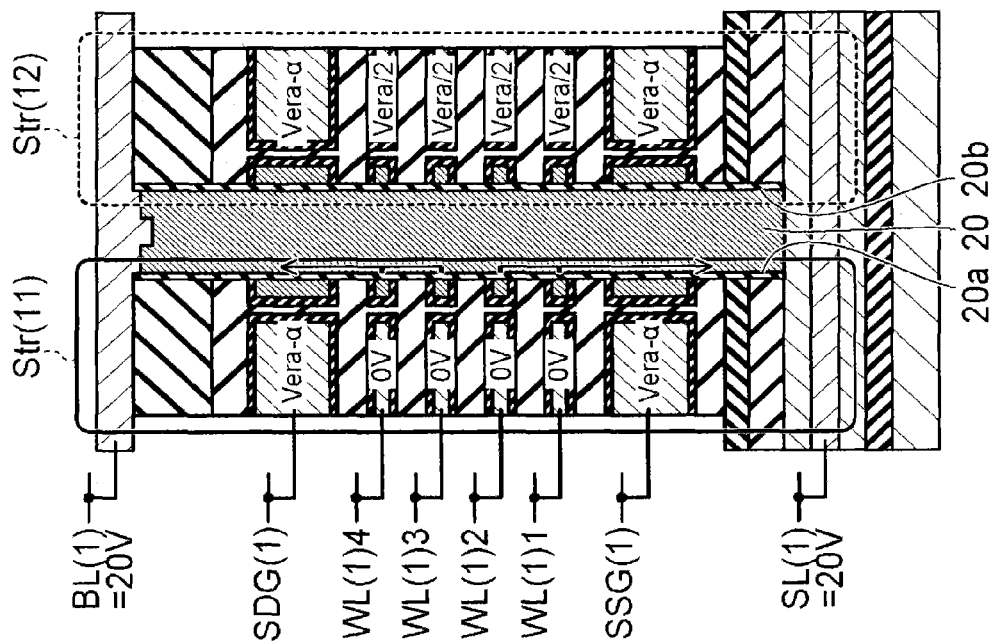

FIGS. 11A and 11B are a conceptual diagram for describing the operation method of the memory device according to the first embodiment.

In the following description, as in the case of FIG. 6, the word lines in the first column and the third column are connected to each other and the word lines in the second column and the fourth column are connected to each other. The memory element strings in the first column and the second column are disposed on the opposed surfaces of the silicon pillar 20 to use the silicon pillar 20 in common. The memory element strings in the third column and the fourth column are disposed respectively the same as the memory element strings in the first column and the second column.

First, writing of data in a specific memory element 30 is described. The data is written in the memory element M2 of the second bit in the first row and the first column. Note that, in FIGS. 7, 8, 10, 11A, and 11B, flowing of an electric current (charges) is indicated by an arrow. Portions where an electric current does not flow are indicated by X. The charges are electrons. A flowing direction of the electrons is a positive direction of the arrow unless specifically noted otherwise.

First, the memory element M2 in which data is written is selected.

As shown in FIG. 7, in order to select the first row, the bit line BL(1) in the first row is selected. To select the bit line BL(1), 0 V is supplied to the bit line BL(1) by the control unit 3. When the bit line BL(1) in the first row is selected, bit lines BL(k) in the other rows are not selected. In BL(k), k is a natural number other than 1. To not select the bit lines BL(k) in the other rows, as shown in FIG. 8, a power supply voltage Vdd is supplied to the bit lines BL(k) by the control unit 3. The power supply voltage Vdd is, for example, 2.5 V.

Subsequently, to select the first column, a voltage is supplied to the selection line SDG(1) of the selection transistor 4d in the first column. The voltage applied to the selection line SDG(1) is, for example, 2.5 V. Since the selection transistors 4d in the other columns are not selected, for example, 0 V is supplied to the selection lines SDG(j≠1). Note that, in the write mode, since charge injection is not performed from the cell source line 15, the selection transistor 4s on the source side is not selected.

In this way, the memory element string Str(11) in the first row and the first column is selected. In FIG. 7, the selected memory element string Str(11) is surrounded by a solid line. Unselected memory element strings Str(12) to Str(14) are surrounded by broken lines.

In order to select the memory element M2 of the second bit in the first column, a write voltage is supplied to the word line WL(1)2 of the second bit in the first column. A write voltage Vpgm applied to the word line in the write mode is, for example, 20 V.

In the selected memory element string Str(11), to the word lines WL(1)1, WL(1)3, and WL(1)4 of unselected memory elements, that is, the memory elements M1, M3, and M4 of the first bit, the third bit, and the fourth bit, a channel forming voltage Vpass for forming a channel on the surface of the silicon pillar is supplied. The channel forming voltage Vpass is a voltage necessary to form a channel. The channel forming voltage Vpass is a voltage in a degree for not causing a tunnel current in the tunnel insulating film 33 and is, for example, 10 V.

Vpass is applied to the word lines WL(2)1 to WL(2)4 of the memory elements M1 to M4 of the first to fourth bits included in the memory element string Str(12) that uses the silicon pillar 20 in common with the selected memory element string Str(11). Since the selection line SDG(2) of the selection transistor has 0 V, the plane 20b side of the memory element string Str(12) is in a floating state. Charges do not flow and writing is not performed on the plane 20b side of the memory element string Str(12).

The word line in the first column and the word line in the third column are connected to each other for each bit corresponding thereto. Therefore, the same voltage is applied to the word line of the bits of the memory element string Str(11) in the first column and the memory element string Str(13) in the third column irrespective of a selection state of the respective bits. That is, when 20 V is applied to the word line WL(1)2 of the memory element M2 of the second bit in the first column set as a selection target, at the same time, 20 V is also applied to the word line WL(3)2 of the memory element M2 of the second bit in the third column. However, since the selection transistor 4d in the third column is not selected, channel sections of the first to fourth bits change to a floating state (a boost state). Writing of data is not performed. A voltage same as the voltage applied to the word lines of the bits of the memory element string Str(12) in the second column is applied to the memory element string Str(14) in the fourth column. Since the memory element string Str(14) in the fourth column uses the silicon pillar in common with the memory element string Str(13) in the third column, the channel of the memory element string Str(14) in the fourth column changes to the boost state like the channel of the memory device element Str(13) in the third column. Therefore, writing is not performed.

As shown in FIG. 8, the power supply voltage Vdd is applied to the bit line BL(k) in the unselected k-th row. Vdd is, for example, 2.5 V. A voltage of the same potential as selection line SDG(1) of the selection transistor in the first column is applied to the selection line SDG(1) of the selection transistor in the first column. The selection transistor having SDG(1) is in a cut-off state. In this case, the channel section changes to the boost state. The channel section has potential of about 5 V to 11 V. Therefore, a potential difference between the channel section and the word line WL(1)2 is not so high as to generate a tunnel current. Therefore, writing of data is not performed.

In the case of FIG. 8, in the word line leading region Rc, the word lines in the first column and the third column are connected to each other and the word lines in the second column and the fourth column are connected to each other. Therefore, the connected word lines have the same potential in the respective columns. However, since the channel changes to the boost state, writing is performed in none of the memory element strings Str(k1) to Str(k4).

As described above, in the memory element 30 that use the silicon pillar 20 in common and are disposed in the positions opposed to each other, the channel forming voltage Vpass lower than the write voltage Vpgm is applied to the channel section of the memory element to which writing is not performed. Consequently, the memory elements do not interfere with each other and normal writing can be performed.

Note that the above description of the writing operation indicates one step of incremental stepup programming performed in typical NAND flash memories. After a write enable signal is input, a procedure described below is repeated to perform the writing operation. That is, an operation executed in the order is set as one cycle, which is writing at low Vpgm (e.g., 12 V), verifying readout concerning whether the writing reaches a predetermined writing level (verify readout), writing at increased Vpgm (e.g., 12.5 V), and verifying the readout. The cycle operation is repeated until a writing end. A basic operation of the verify readout is performed in the same manner as a readout operation described below.

The readout mode of data is subsequently described.

It is known that a threshold voltage of an SOI-type MOS transistor formed on an SOI substrate changes according to a bias state of a back gate side. In FIG. 9A, a graph is shown in which a relation between a gate voltage VG and a drain current ID on a MOS transistor side is plotted with a voltage on a back gate side set as a parameter. The curves illustrate different ID-VG characteristics as a function of the back gate voltage. The back gate voltage moves to more positive and more negative values as indicated by the arrow. Front- and back-channel current regions are indicated. When a voltage on the back gate side is high, the MOS transistor falls into a complete depletion state in which an entire SOI region is depleted. The MOS transistor cannot be turned off unless a negative voltage is applied to a front gate electrode of the MOS transistor (an "A" region and an "a" region). FIG. 9B shows depletion layer widths Dfg and Dgb in a region sandwiched by a front gate oxide and a back gate oxide in a "B" (shaded) region of FIG. 9. The depletion layer width Dbg changes according to a bias voltage on the back gate side. Therefore, curves of energy levels Ec and Ev of a conduction band and a valence band are larger as the voltage on the back gate side is higher. The Fermi level Ef is also illustrated. Therefore, an energy level on the MOS transistor side is also curved. The depletion layer width Dfg changes. The threshold voltage on the front gate side of the MOS transistor changes. When a negative voltage having a sufficiently large absolute value is applied to the back gate side, a back gate oxide film interface side changes to an accumulation state. Therefore, the threshold of the MOS transistor on the front gate side takes a substantially fixed value irrespective of the applied voltage on the back gate side (a "C" region).

In the case of the semiconductor memory device 1 of the embodiment, according to an applied voltage to the control gate electrode films 21 of the memory elements 30 formed on the side of one plane 20a of the silicon pillar 20, a threshold of the memory elements 30 formed on the side of the other plane 20b shifts and vice versa. When a voltage is applied to the control gate electrode films 21 of the memory elements 30 on the side of the other surface 20b, the threshold of the memory elements 30 on the side of one plane 20a shifts. For example, a threshold voltage of the memory elements of the second bit in the first row and the first column from which data is about to be read out depends on a voltage applied to the word line of the memory element belonging to the memory element string Str(12) in the first row and the second column that uses the silicon pillar in common with the memory elements.

In the semiconductor memory device 1 of the embodiment, a negative voltage Vr_neg having a sufficiently large absolute value is applied to the word lines of the memory elements of the memory element strings disposed in opposed positions via the silicon pillar 20 common to the memory element string including the selected memory element. The surface of the silicon pillar is changed to the accumulation state. The negative voltage Vr_neg applied to the word lines of the memory element strings only has to be a voltage enough for changing the surface of the silicon pillar to the accumulation state. Therefore, a voltage not less than an erase threshold voltage during data erasing is applied. That is, when a lower limit of the erase threshold voltage is represented as Vthe_min, the negative voltage Vr_neg needs to satisfy the following:

$$Vr\_neg < Vthe\_min$$

A specific example is described. In FIG. 10, the memory element M2 of the second bit in the first row and the first column is selected.

First, in order to select the first row, the bit line BL(1) in the first row and the cell source line SL(1) in the first row are selected. For example, 0.25 V is applied to the bit line BL(1) and the cell source line SL(1) to be selected. Note that, although not shown in the figure, Vdd, for example, 2.5 V is applied to unselected bit lines.

Subsequently, in order to select the first column, the selection transistors 4s and 4d in the first column are turned on. For example, 4.3 V is applied to the selection lines SDG(1) and SSG(1). In this way, the memory element string Str(11) in the first row and the first column is selected.

All the unselected memory elements in the memory element string Str(11) are turned on. For example, a voltage of approximately 5 V to 8 V is applied to, for example, the word lines of the unselected memory elements to form a channel on the surface of the silicon pillar 20.

Since data is read out from the memory element string Str(11) in the first row and the first column, the memory element string Str(11) and the silicon pillar 20 are used in common. In order to change the plane 20b of the silicon pillar 20 on the memory element string Str(12) side to the accumulation state, the negative voltage Vr_neg is applied to the word lines WL(2)1 to WL(2)4 of the memory element of the memory element string Str(12) in a position opposed to the memory element string Str(11). When a lower limit of the erase threshold voltage is represented as Vthe_min, the negative voltage Vr_neg satisfies a relation Vr_neg<Vthe_min and is, for example, −10 to −5 V.

In order to read out data from the memory element of the second bit in the first row and the first column, for example, a voltage of 5 V is applied to the word line WL(1)2 of the memory element M2. An electric current flowing to the cell source line SL(1) is detected by a sense amplifier (not shown in the figure) connected to the cell source line SL(1). When written data is binary values, a positive gate voltage is applied. Presence or absence of the data is detected according to whether a current value is larger or smaller than a threshold. When data is ternary or larger values, positive gate voltages of two levels are sequentially applied. The first state without current flowing irrespective of the gate voltage level applied, the second state which the current flows at the high level gate voltage applied and the current does not flow at the lower level gate voltage applied, and the third state with current flowing irrespective of the gate voltage level applied are respectively associated with stored data. For example, as shown in FIGS. 9A and 9B, in case of three level data in one memory unit, the threshold changes according to a charge injection amount into the floating gate electrode films 31. Therefore, threshold voltages are represented as AR, BR, and CR in order from the lowest threshold voltage. The stored data may be data in which binary numbers 01, 00, and 10 are respectively associated with the threshold voltages AR, BR, and CR.

The word lines in the first column and the third column are electrically connected in the word line leading region Rc. Therefore, a voltage of the word line in the third column, which is an unselected column, is the same as the voltage of the first word line. When the word lines in the second column and the fourth column are electrically connected in the word line leading region Rc, the same voltage is applied to the word lines. However, since 0 V is applied to the selection lines SDG and SSG of the selection transistor in the unselected column, charges are not transferred from the bit lines and readout is not performed.

As described above, in the case of the memory elements that use the silicon pillar in common, the channel section of the memory element on the side where readout is not performed is applied the negative voltage enough for a change to the accumulation state to the gate terminal of the memory element. Consequently, it is possible to suppress shift in the threshold of the memory element on the side where readout is performed and perform normal readout.

The erase mode for data is subsequently described.

In the erase mode for data, an erasing operation is performed for each selected block. In FIG. 11A, one of the two memory element strings Str(11) and Str(12) having the silicon pillar 20 in common belongs to a selected block and the other belongs to a unselected block. In FIG. 11B, both of two memory element strings Str(i,j) and Str(i,j+1) using the silicon pillar 20 in common belong to the unselected block.

As shown in FIG. 11A, in the selected block, a voltage for erasing is applied to a bit line and a cell source line belonging to the selected block. An erasing voltage is, for example, 20 V.

A selection transistor belonging to the selected block is turned on to form a channel. For example, 10 V to 15 V is applied to the selection lines SSG and SDG of the selection transistor.

All word lines of the memory elements belonging to the selected block are set to 0 V.

By setting the word lines in this way, electrons injected into the floating gate electrode films 31 of the memory elements in the selected block are led out to the side of the silicon pillar where the channel is formed and flow to the bit line and the cell source line. Since charges in the floating gate electrode film are removed, data is erased.

In the memory element string included the unselected block, a voltage for a potential difference in a degree for not generating a tunnel current in the tunnel insulating films 33 of the memory elements is applied to the control gate electrode film 21. For example, a half voltage of the erasing voltage Vera is applied.

In this way, even when the memory element string having the silicon pillar 20 in common with the memory element string in the selected block is included in the unselected block, it is possible to prevent data from erasing in the memory element string by turning off the selection transistor. That is, the two memory element strings having the silicon pillar 20 in common may be respectively included in different erasing blocks. It is possible to improve a degree of flexibility of arrangement of memory cells and interconnections.

As shown in FIG. 11B, in the unselected block, a voltage for data erasing is applied to the bit line and the cell source line.

The selection transistor belonging to the selected block is turned on to form a channel.

The word lines of the memory elements belonging to the unselected block are set to a voltage lower than the erasing voltage, which a degree does not generate a tunnel current between a voltage of the bit line and the voltage of the word lines and between a voltage of cell source line and the voltage of the word line. The voltage of the word lines of the memory elements of the unselected block is, for example, 10 V, which is a half of the erasing voltage Vera.

In this way, in the erase mode for data, irrespective of whether the memory element string uses the silicon pillar 20 in common, all of the bit lines and the cell source lines of the selected block and the unselected block are set to the erasing voltage. The word lines of the selected block are set to 0 V and the word lines of the unselected block are set to a voltage lower than the erasing voltage. Consequently, it is possible to erase data of all the memory elements of the selected block.

As described above, in the semiconductor memory device 1 of the embodiment, by appropriately setting the voltages of the word lines of the memory elements, it is possible to use the silicon pillar in common between the memory element strings. Therefore, since it is unnecessary to provide an insulation region for separating the memory element strings for each silicon pillar, it is possible to reduce an occupied area of the insulation region for separation and improve a bit integration degree.

A manufacturing method for the semiconductor memory device 1 according to the embodiment is subsequently described.

FIGS. 12A to 23A are sectional views illustrating a manufacturing method for the memory device according to the embodiment.

FIGS. 12B to 23B are respectively sectional views taken along line A-A' in FIGS. 12A to 23A.

Figure 23B:
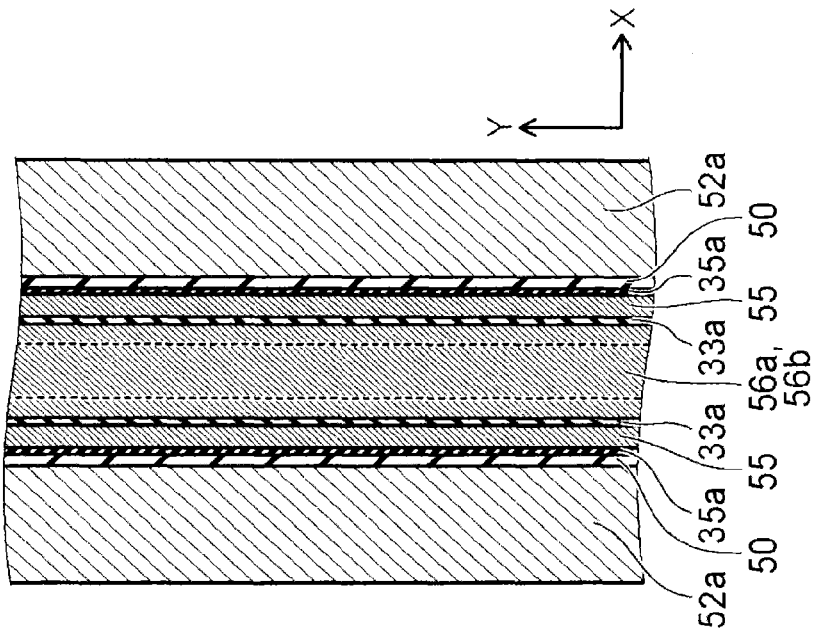
FIG. 23B is a sectional view taken along line A-A' in FIG. 23A.

FIGS. 24A to 24D are sectional views illustrating the manufacturing method for the memory device according to the first embodiment and show a cross section corresponding to FIG. 23B.

Figure 25:
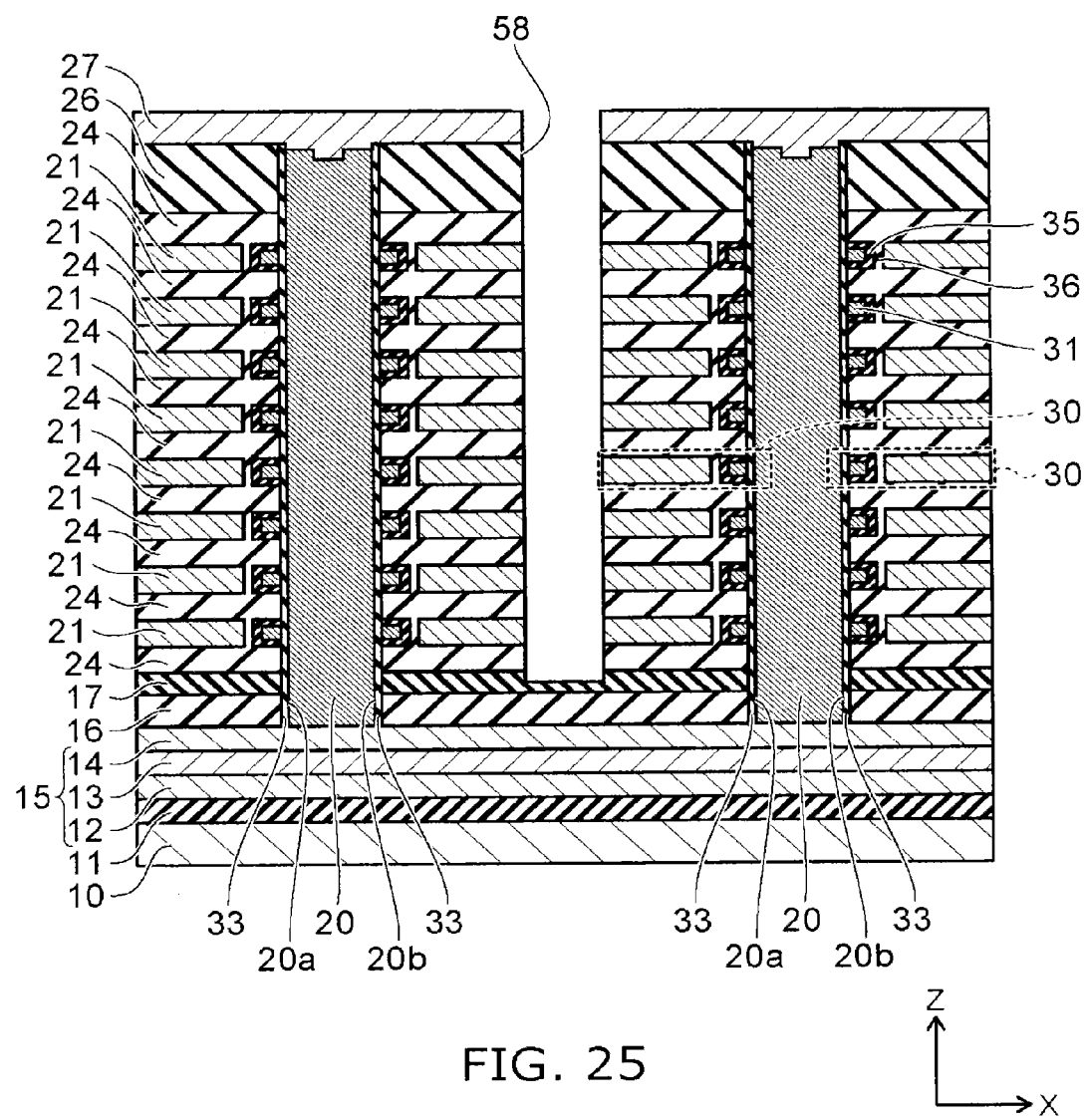
FIG. 25 is a sectional view illustrating the manufacturing method for the memory device according to the first embodiment.

FIG. 25 is a sectional view illustrating the manufacturing method for the memory device according to the first embodiment.

Figure 26:
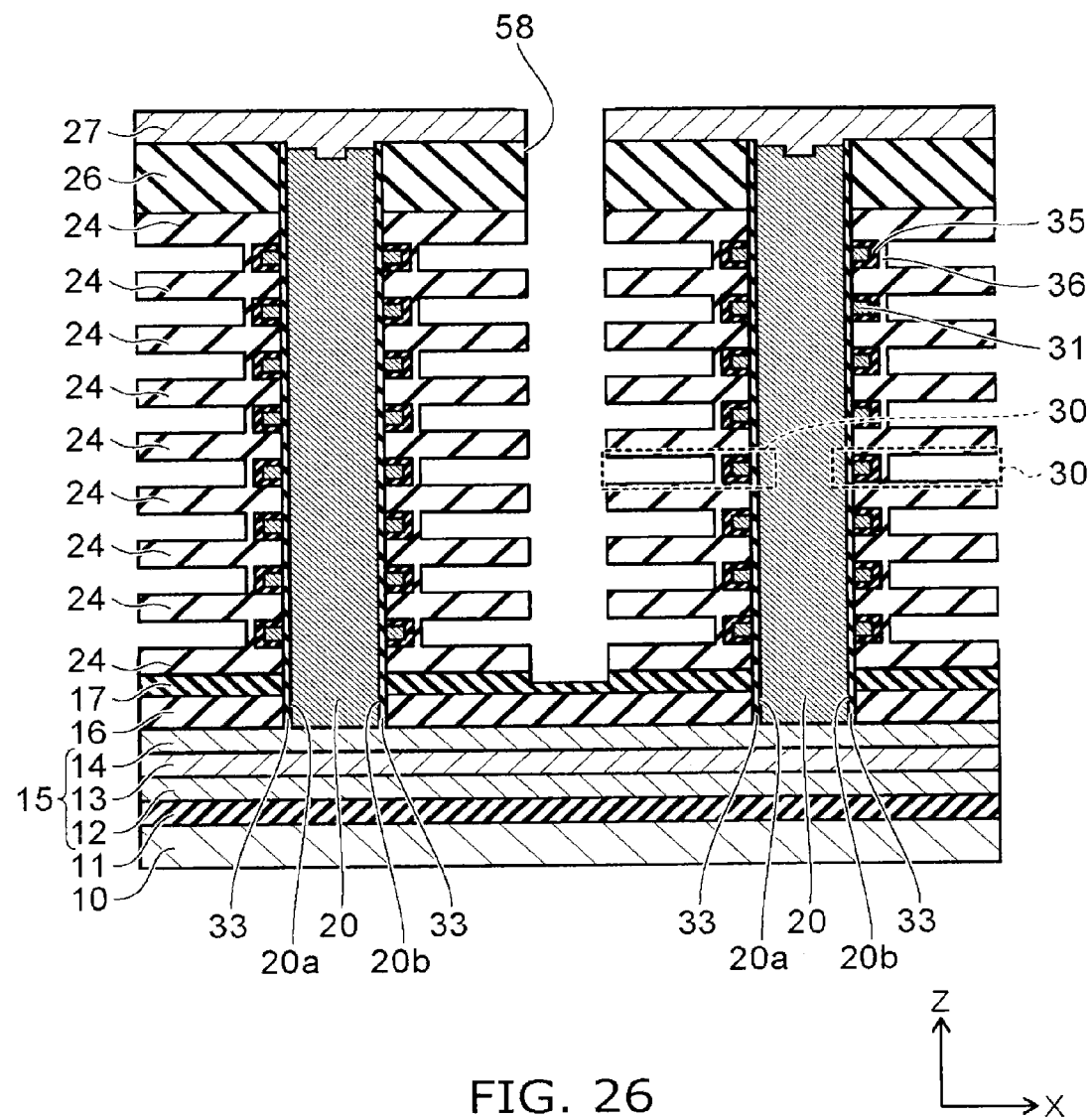
FIG. 26 is a sectional view illustrating the manufacturing method for the memory device according to the first embodiment.

FIG. 26 is a sectional view illustrating the manufacturing method for the memory device according to the first embodiment.

Figure 27:
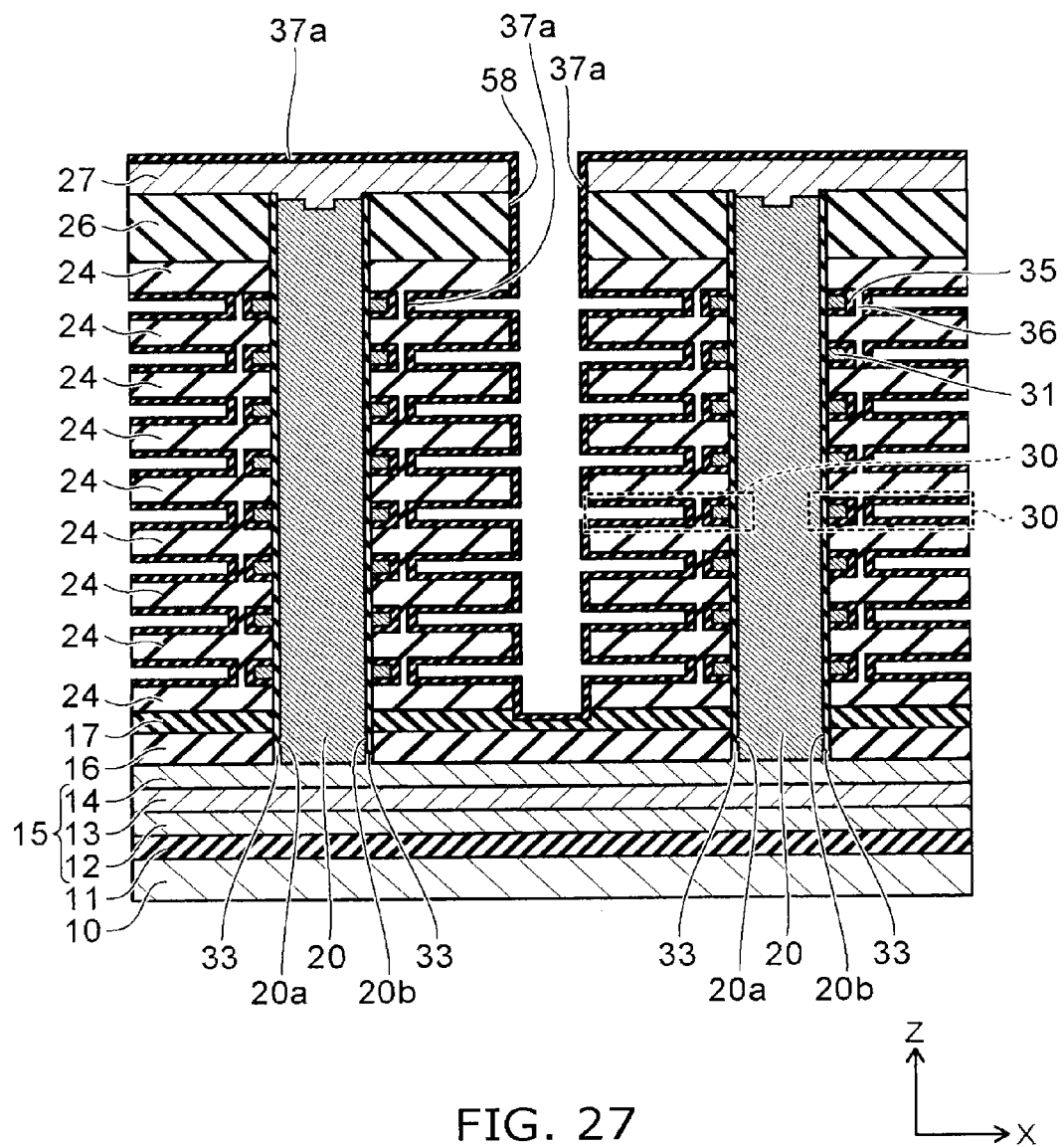
FIG. 27 is a sectional view illustrating the manufacturing method for the memory device according to the first embodiment.

FIG. 27 is a sectional view illustrating the manufacturing method for the memory device according to the first embodiment.

Figure 28:
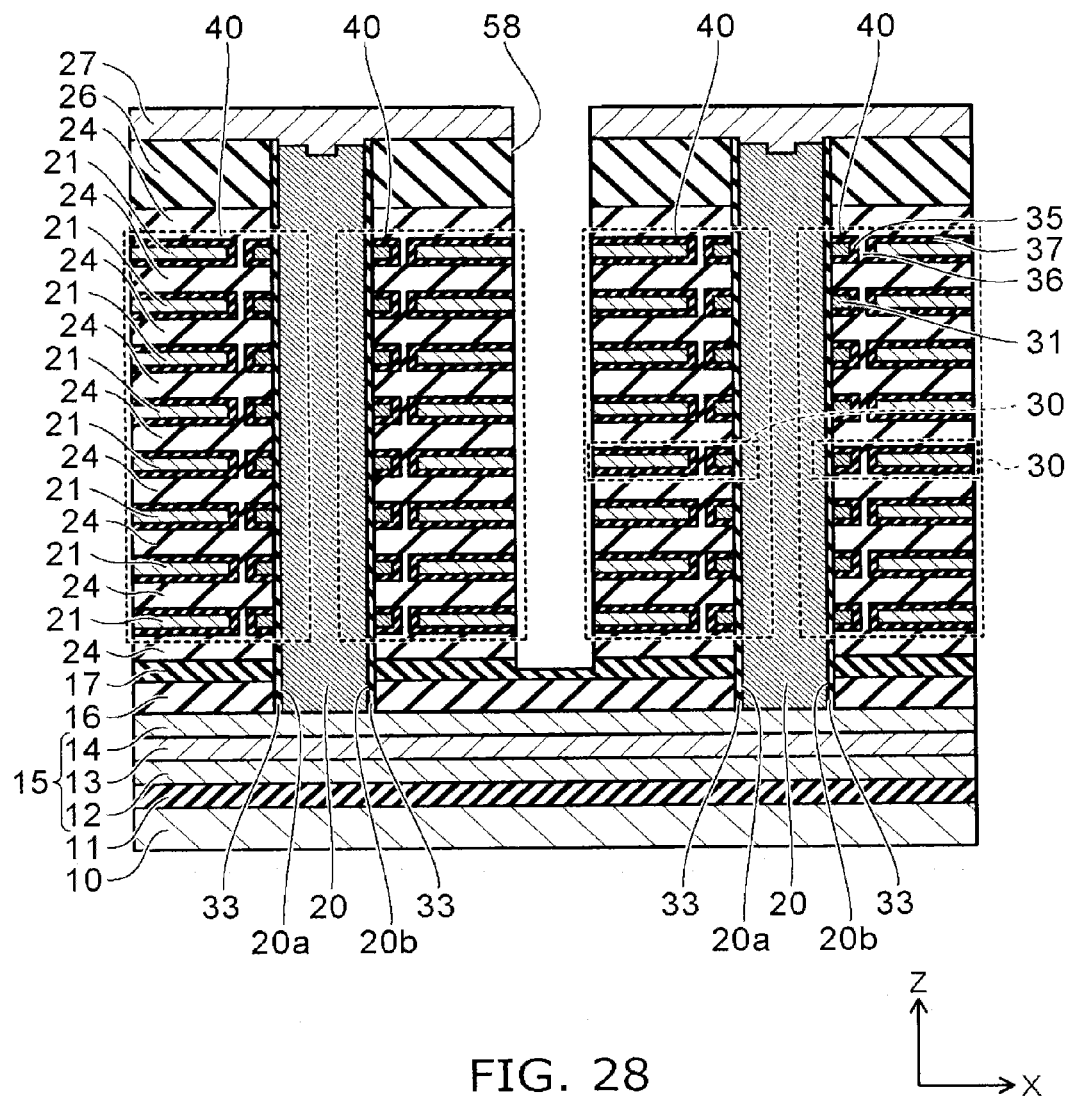
FIG. 28 is a sectional view illustrating the manufacturing method for the memory device according to the first embodiment.

FIG. 28 is a sectional view illustrating the manufacturing method for the memory device according to the first embodiment.

Figure 12B:
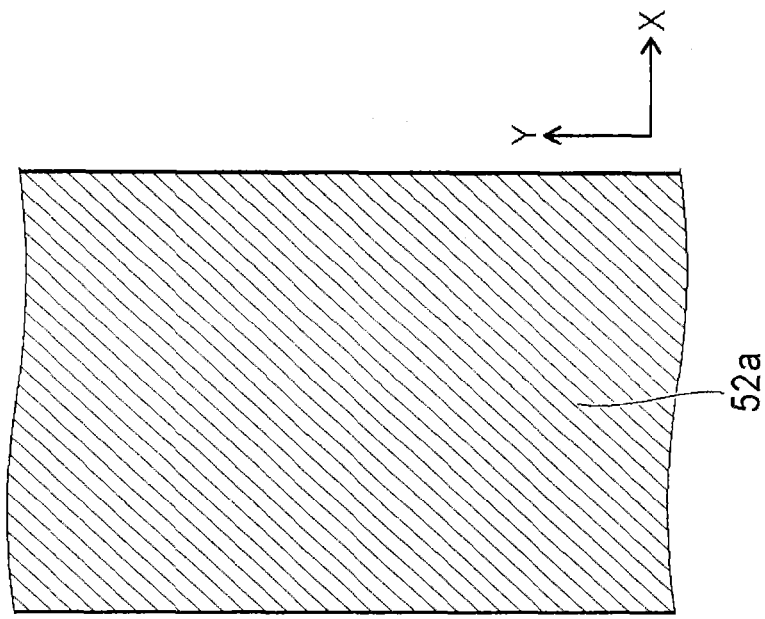
FIG. 12B is a sectional view taken along line A-A' in FIG. 12A.
Figure 12A:
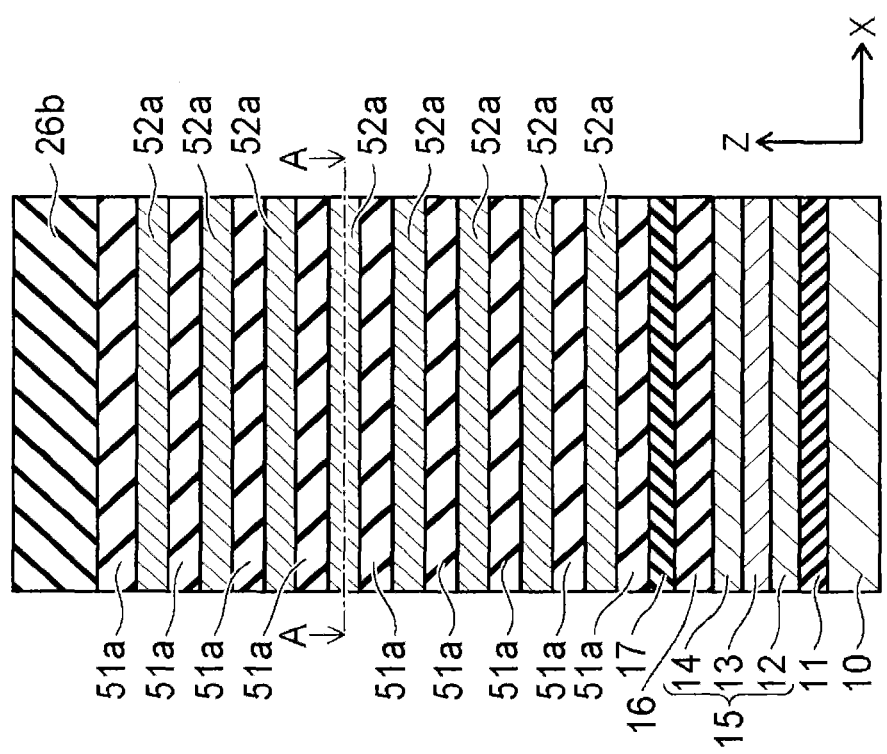
FIG. 12A is a sectional view illustrating a manufacturing method for the memory device according to the first embodiment.

As shown in FIGS. 12A and 12B, the cell source line 15 including the conductive layer 12, the interconnection layer 13, and the conductive layer 14 is formed on the insulating layer 11 formed on the upper surface 10a of the silicon substrate 10. The insulating layers 16 and 17 are formed and then a plurality of silicon oxide films 51 and polysilicon films 52a are stacked. A hard mask 26b is formed on a silicon oxide film 51a of the top layer. The hard mask 26b is formed of, for example, a silicon nitride film.

Figure 13B:
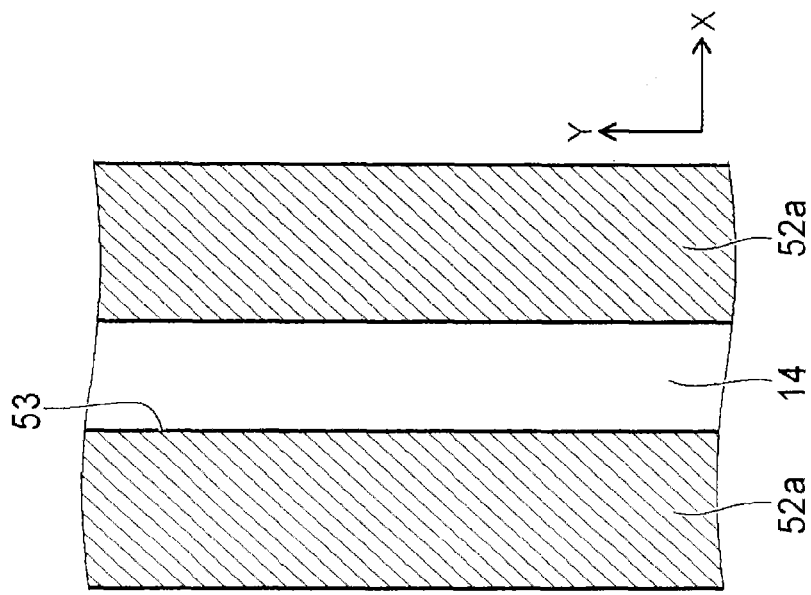
FIG. 13B is a sectional view taken along line A-A' in FIG. 13A.
Figure 13A:
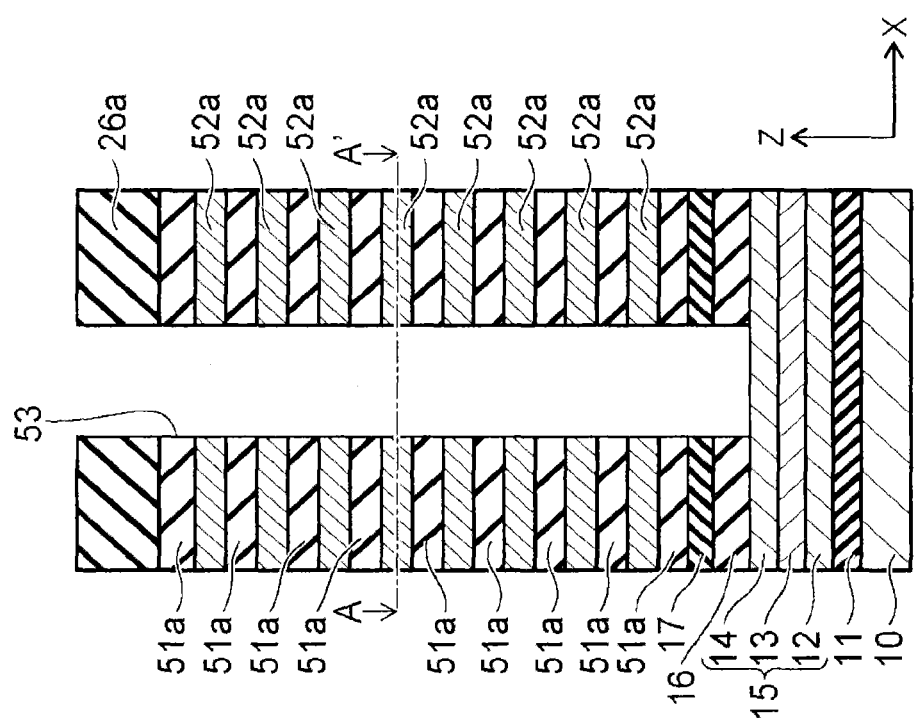
FIG. 13A is a sectional view illustrating a manufacturing method for the memory device according to the first embodiment.

As shown in FIGS. 13A and 13B, the hard mask 26b is patterned. A trench 53 is formed in the stacked body with the patterned hard mask 26b as a mask using an anisotropic etching technology such as reactive ion etching (RIE). The trench 53 is opened to reach the conductive layer 14 piercing through the insulating layers 16 and 17. The trench 53 is opened in a rectangular shape, the long side of which extends in the Y-direction.

Figure 14B:
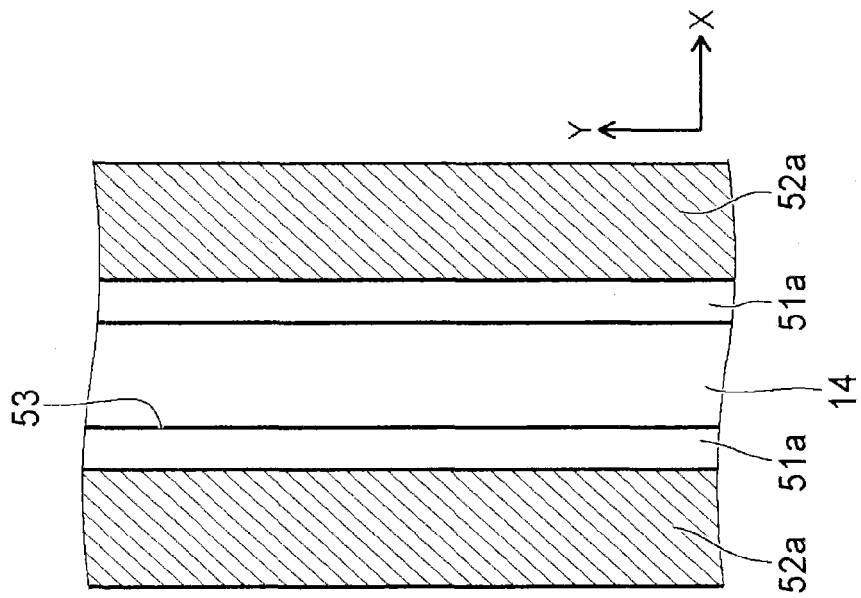
FIG. 14B is a sectional view taken along line A-A' in FIG. 14A.
Figure 14A:
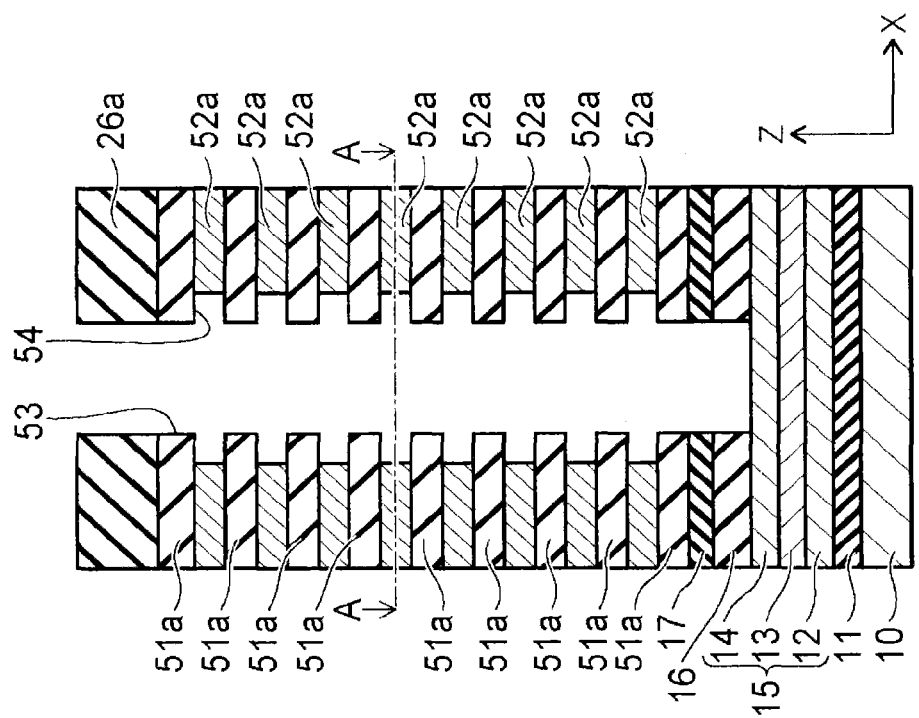
FIG. 14A is a sectional view illustrating a manufacturing method for the memory device according to the first embodiment.

As shown in FIGS. 14A and 14B, wet etching is applied to recess the polysilicon films 52a exposed to the side surface of the trench 53. Recessed sections 54 are formed in regions corresponding to the polysilicon films 52a on the side surface of the trench 53. The recessed sections 54 are formed to surround the trench 53 in the respective polysilicon films 52a.

As shown in FIGS. 15A and 15B, oxidation treatment is applied to the whole surface including the recessed surface using an SPA (Slot Plane Antenna) technique or the like. End faces of the polysilicon films 52a exposed by the recess are covered with a thin silicon oxide layer 50. Note that a part of the silicon oxide layer 50 finally becomes the silicon oxide layer 36 that forms the block insulating film 34.

As shown in FIGS. 16A and 16B, a silicon nitride layer 35a is formed over the entire surface. A polysilicon film 55a is formed on the silicon nitride layer 35a by the CVD or the like. Note that a part of the silicon nitride layer 35a finally becomes the silicon nitride layer 35 that forms the block insulating film 34.

As shown in FIGS. 17A and 17B, the anisotropic etching such as the RIE is applied along the trench 53 to selectively remove the polysilicon film 55a and leave a polysilicon films 55 in the recessed sections 54. Therefore, the polysilicon films 55 remaining in the recessed sections 54 adjacent to each other are divided from each other in the Z-direction. Note that the polysilicon films 55 remaining in the recessed sections 54 finally becomes the floating gate electrode films 31.

As shown in FIGS. 18A and 18B, the anisotropic etching such as the RIE is performed. Consequently, the silicon nitride layer 35a formed on the side surface and the bottom surface of the trench 53 is selectively removed. The silicon nitride layers 35 remaining in the recessed sections 54 adjacent to each other in the Z-direction become a layer that forms the block insulating film 34.

Figure 19B:
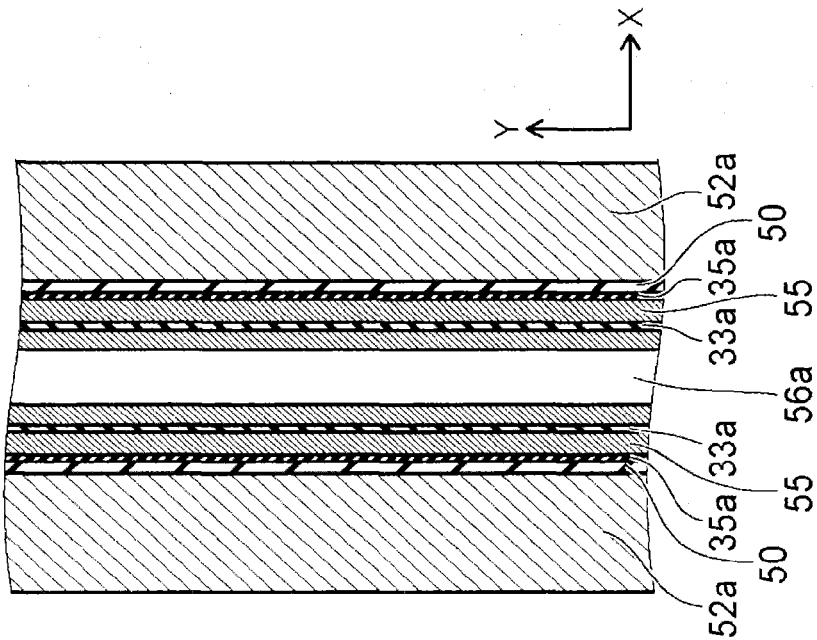
FIG. 19B is a sectional view taken along line A-A' in FIG. 19A.
Figure 19A:
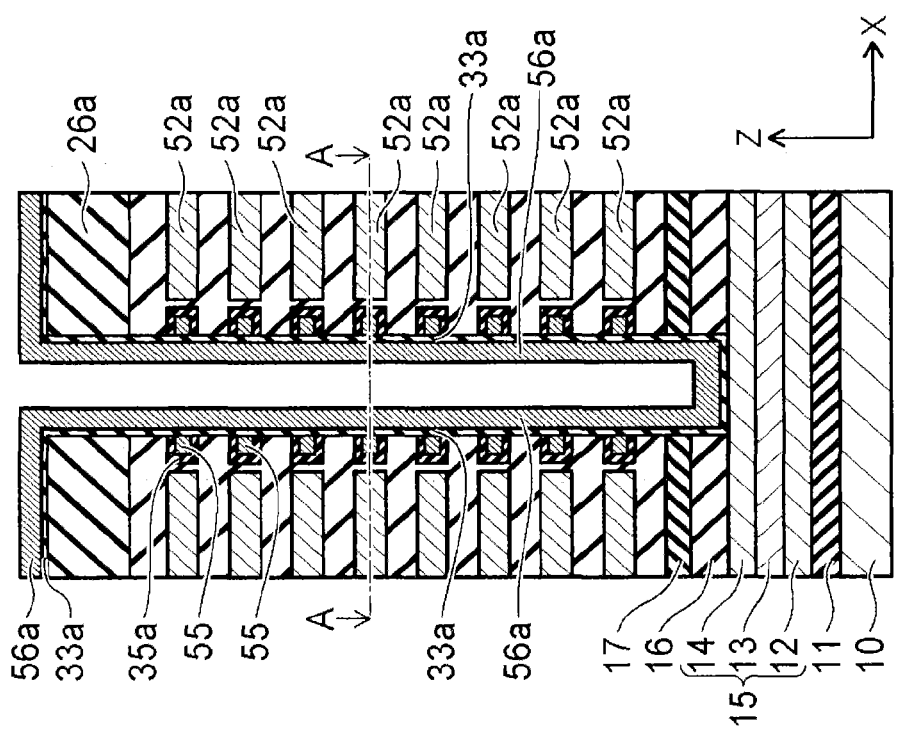
FIG. 19A is a sectional view illustrating a manufacturing method for the memory device according to the first embodiment.

As shown in FIGS. 19A and 19B, a silicon oxide film 33a is formed to cover the entire surface including the side surface and the bottom surface of the trench 53. Further, a polysilicon film 56a is deposited on the silicon oxide film 33a. Note that the silicon oxide film 33a finally becomes the tunnel insulating film 33. Since the polysilicon film 56a deposited provides the surface side of the silicon pillar 20, an applied bias voltage of one side shifts the threshold of the memory element 30 on the other side. Therefore, the polysilicon film 56a is desirably formed of doped polysilicon in which p-type impurities are introduced to suppress the threshold voltage shift.

As shown in FIGS. 20A and 20B, the silicon oxide film 33a and the polysilicon film 56a deposited on the bottom of the trench 53 are removed until the conductive layer 14 is exposed by the anisotropic etching such as the RIE.

As shown in FIGS. 21A and 21B, a polysilicon film 56b is deposited over the entire surface. A lower part of the polysilicon film 56b is connected to the conductive layer 14. Note that the polysilicon films 56a and 56b are formed of undoped polysilicon or p-type doped polysilicon and finally becomes the silicon pillar 20. In order to maintain the accumulation state of the surface of the silicon pillar 20 during readout of data, the polysilicon film 56a on the outer side may be formed of the p-type doped polysilicon and the inner side polysilicon film 56b may be formed as an undoped polysilicon film including acceptor defects. Alternatively, both of the polysilicon films 56a and 56b may be formed as p-type doped polysilicon films.

Figure 22B:
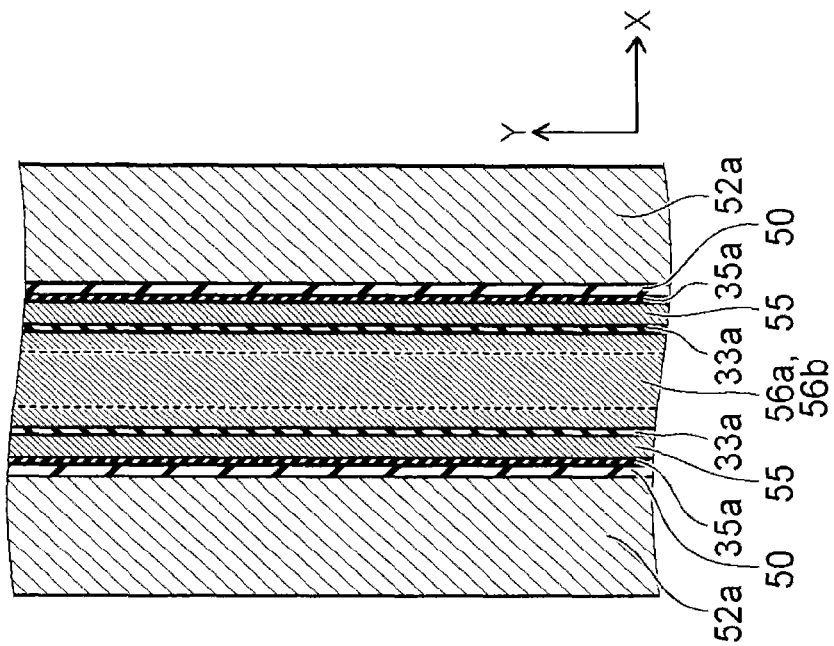
FIG. 22B is a sectional view taken along line A-A' in FIG. 22A.
Figure 22A:
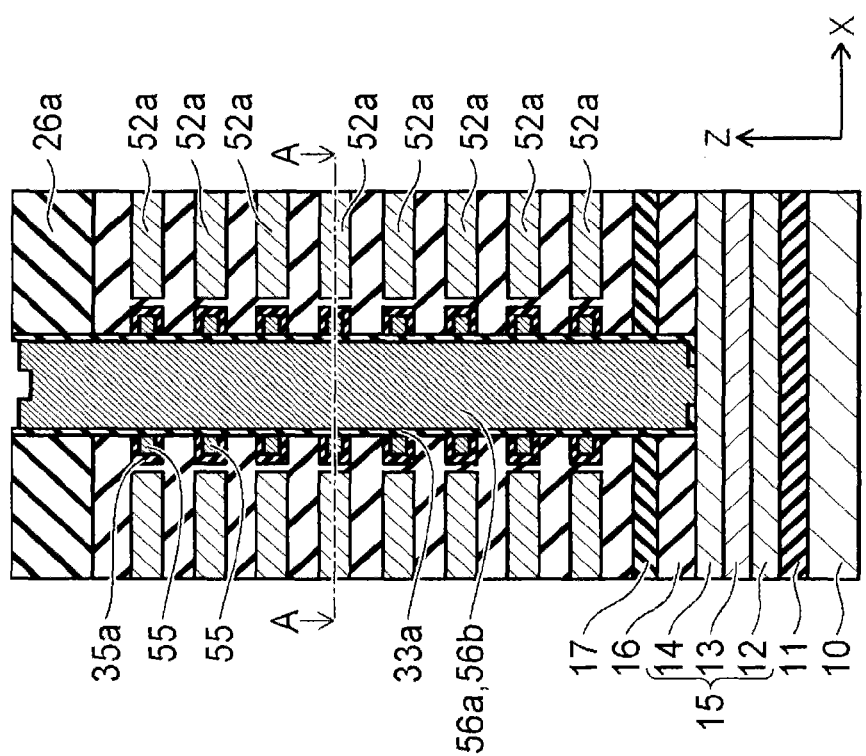
FIG. 22A is a sectional view illustrating a manufacturing method for the memory device according to the first embodiment.

As shown in FIGS. 22A and 22B, the polysilicon film 56b on the upper surface is removed by the RIE or the like.

Figure 23A:
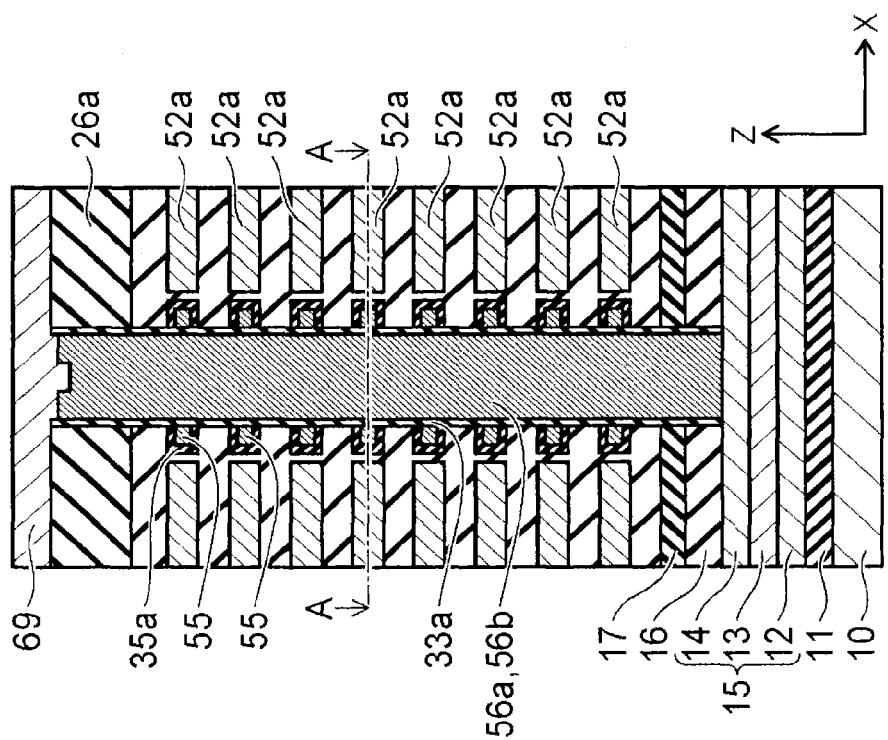
FIG. 23A is a sectional view illustrating a manufacturing method for the memory device according to the first embodiment.

As shown in FIGS. 23A and 23B, a polysilicon layer 69 is deposited over the entire surface by the CVD or the like. Note that the polysilicon layer 69 finally becomes the interconnect 27.

Figure 24A:
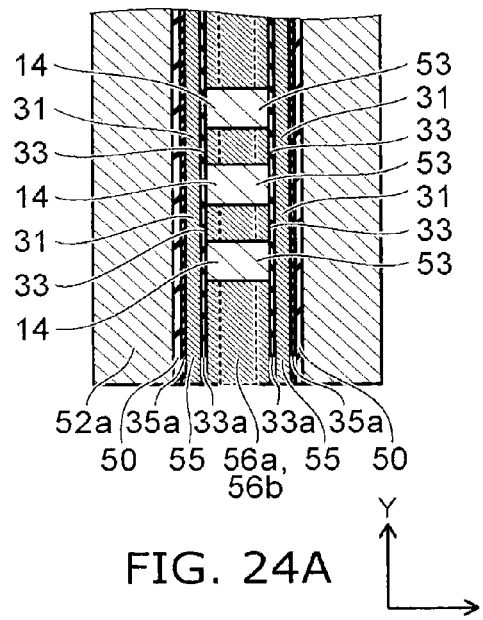
FIG. 24A is a sectional view illustrating the manufacturing method for the memory device according to the first embodiment and show a cross section corresponding to FIG. 23B.

As shown in FIG. 24A, in order to form the memory element strings 40 arrayed in the Y-direction, the polysilicon film 56b is divided along the Y-direction.

Figure 24B:
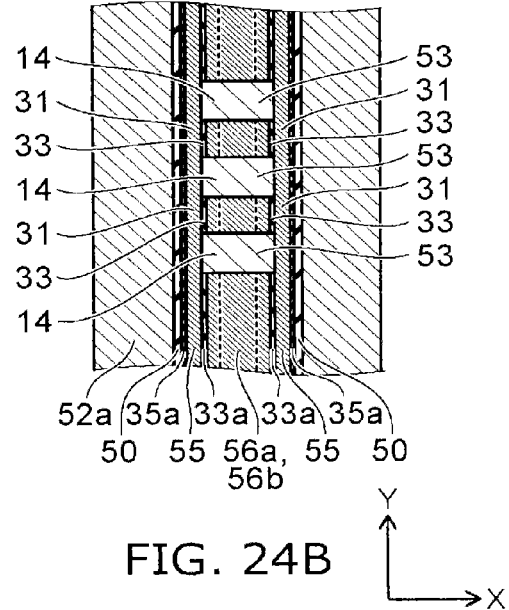
FIG. 24B is a sectional view illustrating the manufacturing method for the memory device according to the first embodiment and show a cross section corresponding to FIG. 23B.

As shown in FIG. 24B, the silicon oxide film 33a is divided by the wet etching or the like.

Figure 24C:
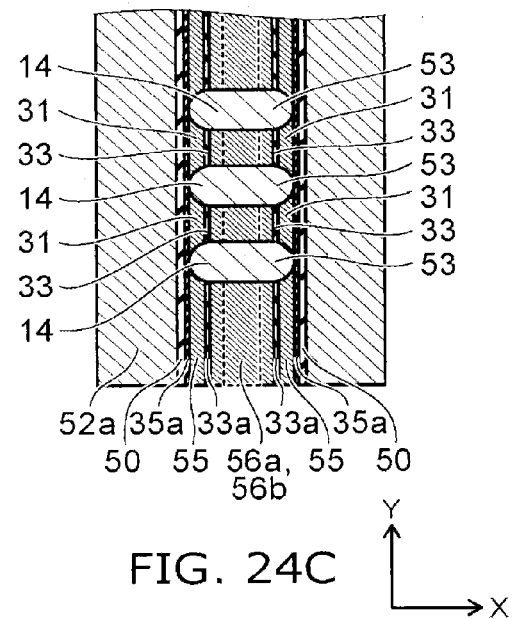
FIG. 24C is a sectional view illustrating the manufacturing method for the memory device according to the first embodiment and show a cross section corresponding to FIG. 23B.

As shown in FIG. 24C, the polysilicon film is divided by the wet etching or the like to form the floating gate electrode films 31. In this case, the centers of exposed surfaces of the polysilicon films 56a and 56b are more preferentially etched than the ends of the exposed surfaces. Therefore, the floating gate electrode films 31 are formed in a fan shape. The length of the floating gate electrode films 31 opposed to the control gate electrode film 21 side can be set longer than the length of the floating gate electrode films 31 opposed to the silicon pillar 20 side.

Figure 24D:
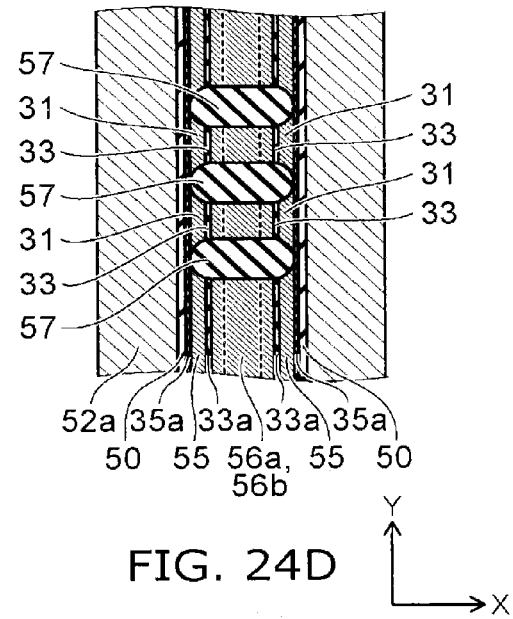
FIG. 24D is a sectional view illustrating the manufacturing method for the memory device according to the first embodiment and show a cross section corresponding to FIG. 23B.

As shown in FIG. 24D, insulating layers 57 are formed in air gaps 53 formed by the dividing processing.

As shown in FIG. 25, between the trenches 53 filled with the polysilicon films 56a and 56b, that is, between the silicon pillars 20 adjacent to each other, a trench 58 reaching the insulating layer 17 is formed by patterning the hard mask 26a. Like the trench 53, the trench 58 is formed in a rectangular shape, the long side of which extends in the Y-direction.

As shown in FIG. 26, by applying the wet etching using a hot TMY solution, the polysilicon films 52a are recessed via the trench 58.

As shown in FIG. 27, a silicon nitride layer 37a is formed over the entire surface. The silicon nitride layer 37a finally becomes the silicon nitride layer 37 that forms the block insulating film 34. Thereafter, as shown in FIG. 28, W or the like is deposited over the entire surface and unnecessary W is removed to form the control gate electrode films 21. After the trench 58, from which W is removed, is filled with the insulating layer 57, an inter-layer insulating layer is formed. The vias 28 are opened in the interlayer insulating layer 23. An electrode material is filled in the vias 28. Thereafter, the bit line 29 is formed to complete the structure shown in FIG. 3A.

The manufacturing process described above is not limited to the order described above. For example, the process for forming the trench 58 and separating the control gate electrode film 21 for the respective memory element strings 40 may be carried out before the process for dividing the silicon pillar 20. Alternatively, the process for dividing the silicon pillar 20 may be executed after the control gate electrode film forming process.

According to the embodiment described above, it is possible to make the semiconductor memory device including the silicon pillar 20 provided between the memory element strings 40 disposed to be opposed to each other.

Second Embodiment

Figure 29:
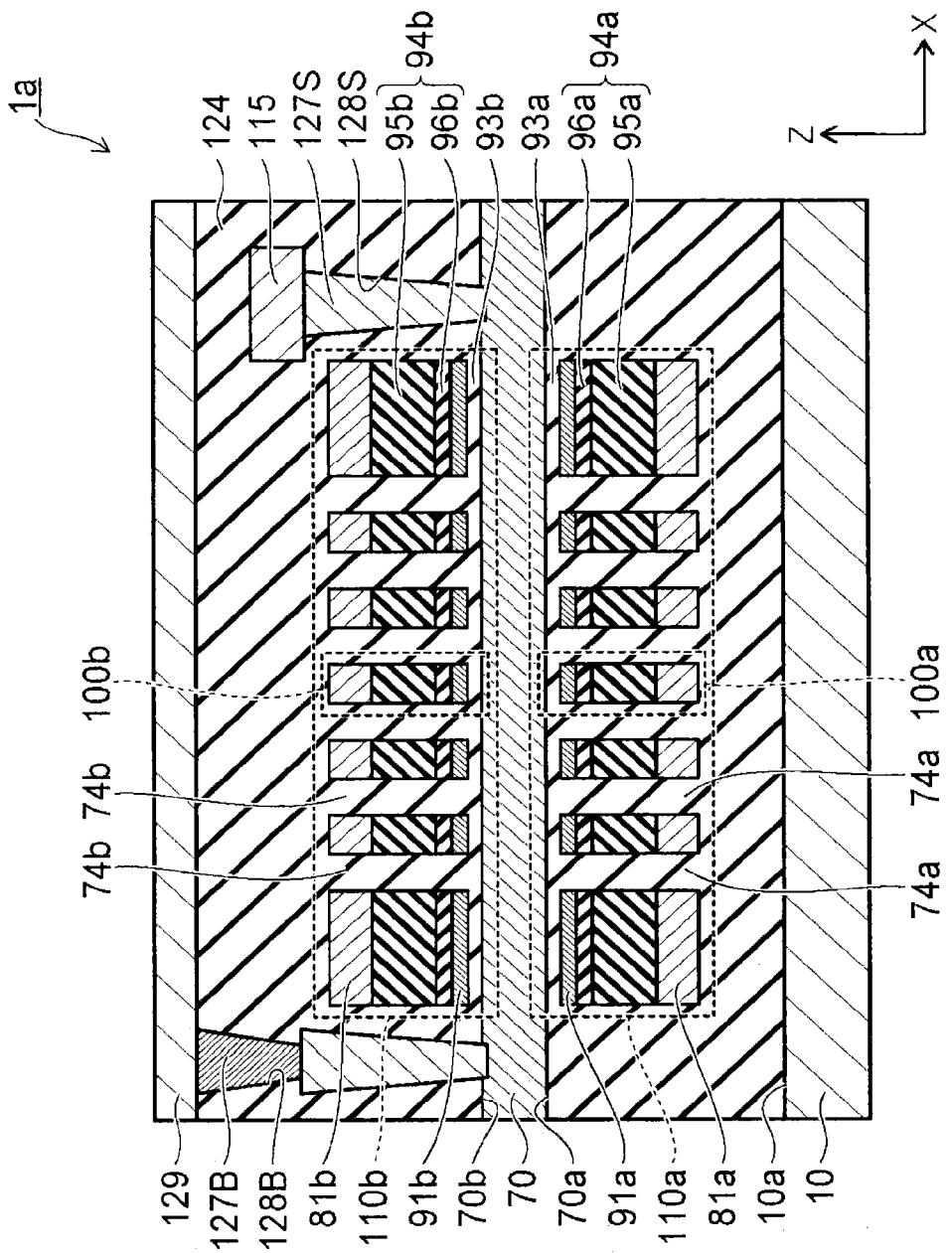
FIG. 29 is a sectional view illustrating the memory device according to a second embodiment.

FIG. 29 is a sectional view illustrating a memory device according to a second embodiment.

Figure 30:
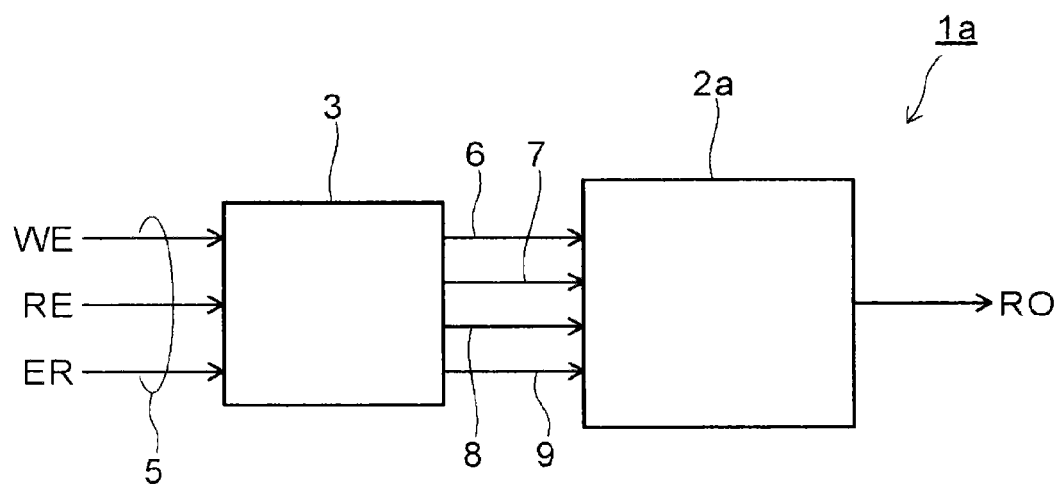
FIG. 30 is a block diagram illustrating the memory device according to the second embodiment.

FIG. 30 is a block diagram illustrating the memory device according to the second embodiment.

In the above description, the semiconductor memory device including the memory element strings 40 formed on the sides of the silicon pillar 20 extending in the up down direction with respect to the silicon substrate is described. However, the semiconductor memory device may include a semiconductor layer in which a channel is formed along a direction parallel to the silicon substrate.

As shown in FIG. 29, a semiconductor memory device 1a in the second embodiment includes the silicon substrate 10 having the upper surface 10a and semiconductor layers 70 extending in the X-direction substantially in parallel to the upper surface 10a of the silicon substrate 10 and having lower surfaces 70a and upper surfaces 70b. The semiconductor layers 70 are disposed spaced in the Y-direction (not shown in the figure) and provided separated from the upper surface 10a of the silicon substrate 10 in the Z-direction. The semiconductor memory device 1a includes a plurality of control gate electrode layers 81a disposed separated from one another in the X-direction between the silicon substrate 10 and the lower surfaces 70a of the semiconductor layers 70. The semiconductor memory device 1a includes floating gate electrode layers 91a provided between the lower surfaces 70a of the semiconductor layers 70 and the control gate electrode layers 81a. The semiconductor memory device 1a includes tunnel insulating layers 93a provided between the lower surfaces 70a of the semiconductor layers 70 and the floating gate electrode layers 91a. The semiconductor memory device 1a includes block insulating layers 94a provided between the floating gate electrode layers 91a and the control gate electrode layers 81a.

The control gate electrode layers 81a are divided from one another in the X-direction by insulating layers 74a. The control gate electrode layers 81a divided in the X-direction extend in the Y-direction and cross the semiconductor layers 70 disposed substantially in parallel to the Y-direction. Therefore, crossing points of the semiconductor layers 70 and the control gate electrode layers 81a are arrayed in a matrix shape on the XY plane.

The floating gate electrode layers 91a are disposed to divide from one another in the X-direction and the Y-direction at the respective crossing points of the semiconductor layers 70 and the control gate electrode layers 81a.

The tunnel insulating layers 93a are formed over the entire lower surfaces 70a of the semiconductor layers 70.

The block insulating layers 94a are two-layer films including first insulating layers 95a made of, for example, a silicon oxide and second insulating layers 96a made of, for example, a silicon nitride. In the block insulating layers 94a, the first insulating layers 95a and the second insulating layers 96a are stacked in this order from the floating gate electrode layers 91a to the control gate electrode layers 81a. The block insulating layers 94a are formed to divide from one another in the X-direction and the Y-direction at the respective crossing points of the semiconductor layers 70 and the control gate electrode layers 81a.

In this way, memory elements 100a are formed by stacking, from the upper surface 10a of the silicon substrate 10, the control gate electrode layers 81a, the second insulating layers 96a, the first insulating layers 95a, the floating gate electrode layers 91a, the tunnel insulating layers 93a, and the semiconductor layers 70 in this order. The memory elements 100a are formed in a matrix shape in the X-direction and the Y-direction at the respective crossing points of the semiconductor layers 70 and the control gate electrode layers 81a.

Memory element strings 110a include a plurality of memory elements having the semiconductor layers 70 in common and arrayed in the X-direction. At both ends in the X-direction of the memory element strings 110a, insulating layers are formed. Insulating layers are formed between the memory element strings 110a and the silicon substrate 10.

The semiconductor memory device is includes control gate electrode layers 81b provided spaced from the upper surfaces 70b of the semiconductor layers 70 upward in the Z-direction and spaced from one another in the X-direction. The semiconductor memory device 1a includes floating gate electrode layers 91b between the upper surfaces 70b of the semiconductor layers 70 and the control gate electrode layers 81b. The semiconductor memory device 1a includes tunnel insulating layers 93b provided between the upper surfaces 70b of the semiconductor layers 70 and the floating gate electrode layers 91b. The semiconductor memory device is includes block insulating layers 94b provided between the floating gate electrode layers 91b and the control gate electrode layers 81b.

The control gate electrode layers 81b are divided from one another in the X-direction by insulating layers 74b. The control gate electrode layers 81b divided in the X-direction extend in the Y-direction and cross the semiconductor layers 70 disposed in the Y-direction. Therefore, crossing points of the semiconductor layers 70 and the control gate electrode layers 81b are arrayed in a matrix shape on the XY plane.

The floating gate electrode layers 91b are disposed to be divided from one another in the X-direction and the Y-direction at the respective crossing points of the semiconductor layers 70 and the control gate electrode layers 81b.

The tunnel insulating layers 93b are formed over the entire upper surfaces 70b of the semiconductor layers 70.

The block insulating layers 94b are two-layer films including first insulating layers 95b made of, for example, a silicon oxide and second insulating layers 96b made of, for example, a silicon nitride. The first insulating layers 95b and the second insulating layers 96b are stacked in this order from the floating gate electrode layers 91b to the control gate electrode layers 81b. The block insulating layers 94b are formed to divide from one another in the X-direction and the Y-direction at the respective crossing points of the semiconductor layers 70 and the control gate electrode layers 81b.

In this way, in memory elements 100b, the tunnel insulating layers 93b, the floating gate electrode layers 91b, the first insulating layers 95b, the second insulating layers 96b, and the control gate electrode layers 81b are stacked in this order from the upper surfaces 70b of the semiconductor layers 70. The memory elements 100b are formed in a matrix shape in the X-direction and the Y-direction at the respective crossing points of the semiconductor layers 70 and the control gate electrode layers 81b. Insulating layers 74b are formed among the memory elements 100b adjacent to one another. In this way, the memory elements 100b have the semiconductor layers 70 in common and are arrayed in the X-direction. Memory element strings 110b extending in the X-direction are formed. At both ends in the X-direction of the memory element strings 110b, insulating layers are formed.

The memory elements 100b forming the memory element strings 110b are respectively disposed in positions opposed to, in the Z-direction, the memory elements 100a that forms the memory element strings 110a. Therefore, the memory element strings 110a and 110b are formed having the semiconductor layers 70 in common and are disposed to be opposed to each other across the semiconductor layers 70. In other words, the semiconductor layers 70 are provided between the two memory elements 100a and 100b and used in common by the two memory elements 100a and 100b.

A cell source line 115 is formed to extend in the Y-direction above the memory element strings 110b. Inter-layer insulating layers 124 are formed between the memory element strings 110b and the cell source line 115. Inter-layer insulating layers 124 are formed between the semiconductor layers 70 and the cell source line 115. Vias 128S filled with conductive layers 127S are formed in the inter-layer insulating layers 124 between the semiconductor layers 70 and the cell source line 115. The semiconductor layers 70 and the cell source line 115 are electrically connected.

Bit lines 129 are formed in the X-direction above the memory element strings 110b and the cell source line 115. The interlayer-insulating layers 124 are formed between the memory element strings 110b and the bit lines 129. The interlayer-insulating layers 124 are formed between the semiconductor layer 70 and the bit lines 129. Vias 128B filled with conductive layers 127B made of, for example, polysilicon, are formed in the inter-layer insulating layers 124. The semiconductor layers 70 and the bit lines 129 are electrically connected by the conductive layers 127B. Note that the inter-layer insulating layers 124 are also formed between the cell source line 115 and the bit lines 129.

As described above, the semiconductor memory device 1a includes the memory element strings 110a and 110b including a plurality of the memory elements 100a and 100b extending in the X-direction, arrayed spaced from one another in the Y-direction, and having the semiconductor layers 70 in common. Therefore, the semiconductor memory device 1a is a lateral-type stacked memory device.

As shown in FIG. 30, the semiconductor memory device 1a according to the embodiment includes a memory cell 2a including the memory element strings 110a and 110b and the control unit 3. The memory cell 2a includes the memory element strings 110a and 110b arrayed in a matrix shape. The memory elements 100a and 100b are three-dimensionally disposed on the memory cell 2a. As the control unit 3a, the control unit same as the control unit 3 of the semiconductor memory device 1 in the first embodiment can be used. Like the semiconductor memory device 1 according to the first embodiment, the semiconductor memory device 1a, which is the lateral-type stacked memory device, includes the memory elements having the semiconductor layers 70, which form channels, in common. Therefore, an applied bias state of the memory elements 100a on one side affects a threshold voltage of the memory elements on the other side. Therefore, as in the semiconductor memory device 1 according to the first embodiment, a voltage applied to the bit line 129, the cell source line 115, and a word line 139 is selected according to the write mode, the readout mode, and the erase mode using the control unit 3a.

As described above, in the semiconductor memory device is of the embodiment, insulating layers that separate the memory element strings 110a and 110b are unnecessary. It is possible to improve a bit integration degree. Since a process forming the insulting layer is unnecessary, a manufacturing process is reduced and a throughput of manufacturing is improved.

As described above, by respectively appropriately setting voltages applied to the control gate electrode films 21 of the memory elements disposed to be opposed to each other across the silicon pillar 20, it is possible to use the silicon pillar 20 in common between the two memory element 30. Therefore, regions that separate the silicon pillars belonging to the respective memory elements are unnecessary. It is possible to improve the bit integration degree. Since a process for separating the silicon pillars is unnecessary, manufacturing is facilitated.

What is claimed is:
1. A memory device, comprising:
a first memory element provided on a first side of a semiconductor member, the first memory element including a first charge storage layer provided between the first side of the semiconductor member and a first electrode film, the semiconductor member extending to a first direction, the first side of the semiconductor member being along the first direction;
a second memory element on a second side of the semiconductor member, the second memory element including a second charge storage layer provided between the second side of the semiconductor member and a second electrode film, the second side being opposed on the first side with the semiconductor member;
a cell source line connected to an end of the semiconductor member; and
a control unit configured to
apply a first voltage to the second electrode film, the first voltage being negative with respect to a voltage of the cell source line, and
apply a second voltage to the first electrode film, the second voltage being positive with respect to the voltage of the cell source line,
when reading out a data from the first memory element,
the semiconductor member including a p-type semiconductor layer, having at least one of defects of an acceptor type and impurities of the acceptor type, the defects having a density or the impurities having a concentration for preventing the semiconductor layer from changing a complete depletion state when the first voltage is applied to the second electrode film and the second voltage is applied to the first electrode film.
2. The device according to claim 1, further comprising:
a first transistor provided on the first side of the semiconductor member and provided in series with the first memory element; and
a second transistor provided on the second side of the semiconductor member and provided in series with the second memory element,
the control unit being configured to turn on the first transistor and turn off the second transistor when reading out the data from the first memory element.
3. The device according to claim 1, wherein the first charge storage layer and the second charge storage layer include silicon.
4. The device according to claim 1, wherein the first charge storage layer and the second charge storage layer include metal.
5. The device according to claim 1, wherein the first electrode film and the second electrode film include silicon.
6. The device according to claim 1, wherein the first electrode film and the second electrode film include metal.
7. A memory device, comprising:
a first memory element provided on a first side of a semiconductor member, the first memory element including a first charge storage layer provided between the first side of the semiconductor member and a first electrode film, the semiconductor member extending to a first direction, the first side of the semiconductor member being along the first direction;
a second memory element on a second side of the semiconductor member, the second memory element including a second charge storage layer provided between the second side of the semiconductor member and a second electrode film, the second side being opposed on the first side with the semiconductor member;

a cell source line connected to an end of the semiconductor member; and a control unit configured to apply a first voltage to the second electrode film, the first voltage being negative with respect to a voltage of the cell source line, and apply a second voltage to the first electrode film, the second voltage being positive with respect to the voltage of the cell source line, when reading out a data from the first memory element, wherein an absolute value of the first voltage is lower than an absolute value of a minimum value of an erase threshold.

8. The device according to claim 7, further comprising:

a first transistor provided on the first side of the semiconductor member and provided in series with the first memory element; and a second transistor provided on the second side of the semiconductor member and provided in series with the second memory element, the control unit being configured to turn on the first transistor and turn off the second transistor when writing the data to the first memory element.

9. The device according to claim 7, wherein the first charge storage layer and the second charge storage layer include silicon.

10. The device according to claim 7, wherein the first charge storage layer and the second charge storage layer include metal.

11. The device according to claim 7, wherein the first electrode film and the second electrode film include silicon.

12. The device according to claim 7, wherein the first electrode film and the second electrode film include metal.

13. A memory device comprising:

a first memory element provided on a first side of a semiconductor member, the first memory element including a first charge storage layer provided between the first side of the semiconductor member and a first electrode film, the semiconductor member extending to a first direction, the first side of the semiconductor member being along the first direction;

a second memory element on a second side of the semiconductor member, the second memory element including a second charge storage layer provided between the second side of the semiconductor member and a second electrode film, the second side being opposed on the first side with the semiconductor member;

a cell source line connected to an end of the semiconductor member; and a control unit configured to apply a first voltage to the first electrode film, the first voltage being negative with respect to a voltage of the cell source line, and apply a second voltage to the second electrode film, the second voltage being negative with respect to the voltage of the cell source line, an absolute value of the second voltage being lower than an absolute value of the first voltage, when erasing a data from the first memory element.

14. The device according to claim 13, wherein the absolute value of the second voltage is a half of the absolute value of the first voltage.

15. The device according to claim 13, wherein the first charge storage layer and the second charge storage layer include silicon.

16. The device according to claim 13, wherein the first charge storage layer and the second charge storage layer include metal.

17. The device according to claim 13, wherein the first electrode film and the second electrode film include silicon.

18. The device according to claim 13, wherein the first electrode film and the second electrode film include metal.

* * * * *